US008605248B2

(12) United States Patent
Kawakubo

(10) Patent No.: US 8,605,248 B2
(45) Date of Patent: Dec. 10, 2013

(54) EXPOSURE METHOD AND LITHOGRAPHY SYSTEM

(75) Inventor: Masaharu Kawakubo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 139 days.

(21) Appl. No.: 11/915,504

(22) PCT Filed: May 24, 2006

(86) PCT No.: PCT/JP2006/310314
§ 371 (c)(1),
(2), (4) Date: Nov. 30, 2007

(87) PCT Pub. No.: WO2006/126569
PCT Pub. Date: Nov. 30, 2006

(65) Prior Publication Data
US 2008/0259297 A1    Oct. 23, 2008

(30) Foreign Application Priority Data
May 25, 2005    (JP) ................................. 2005-152974

(51) Int. Cl.
*G03B 27/68*    (2006.01)
(52) U.S. Cl.
USPC .......................................................... 355/52
(58) Field of Classification Search
USPC ............... 438/763, 725, 942; 430/22, 30, 312
See application file for complete search history.

(56) References Cited

U.S. PATENT DOCUMENTS

| | | | |
|---|---|---|---|
| 5,448,332 A | | 9/1995 | Sakakibara et al. |
| 6,957,119 B2 * | | 10/2005 | Peng et al. .................... 700/121 |
| 2002/0111038 A1 * | | 8/2002 | Matsumoto et al. .......... 438/763 |
| 2004/0071336 A1 * | | 4/2004 | Yui .............................. 382/147 |

FOREIGN PATENT DOCUMENTS

| | | |
|---|---|---|
| JP | 6-283403 | 10/1994 |
| JP | 2591746 | 3/1997 |
| JP | 2000-36451 | 2/2000 |
| JP | 2002-222752 | 8/2002 |
| JP | 2003-59809 | 2/2003 |

OTHER PUBLICATIONS

Search Report issued in corresponding International Patent Application No. PCT/JP2006/310314.
Japanese Patent Office Notification of Reasons for Refusal mailed May 6, 2011 for corresponding Japanese Patent Application No. 2007-517851.
Japanese Patent Office Notification of Reason(s) for Refusal mailed Mar. 28, 2012, for corresponding Japanese Patent Application No. 2007-517851.
PCT Written Opinion mailed Aug. 1, 2006, for corresponding International Application No. PCT/JP2006/310314.
Korean Office Action mailed Jun. 13, 2012 issued in corresponding Korean Patent Application No. 10-2007-7027162.

* cited by examiner

*Primary Examiner* — Peter B Kim
*Assistant Examiner* — Deoram Persaud

(57) ABSTRACT

In the case where the previous process (X) and the previous process (Y) are different in step 310, only a distortion amount in an X-axis direction is extracted from image distortion data of the previous process (X) in Step 316 and only a distortion amount in a Y-axis direction is extracted from image distortion data of the previous process (Y) in Step 318, and then in Step 320, image distortion data is created by synthesizing the extracted distortion amounts, and the synthesized image distortion data is used for subsequent adjustment of projected images. With this operation, the distortion of projected images can be adjusted per axis and accordingly overlay exposure with high accuracy can be realized.

16 Claims, 11 Drawing Sheets

*Fig. 3A*

|  | $100_1$ | $100_2$ | $100_3$ | $100_4$ | $100_5$ |
|---|---|---|---|---|---|
| 2005-11 | ▦ | ▦ | ▦ | ▦ | ▦ |
| 2005-12 | ▦ | ▦ | ▦ | ▦ | ▦ |

*Fig. 3B*

| APPARATUS NAME | PROCESS NAME | PROCESSING DATE AND TIME | IMAGE DISTORTION CORRECTION VALUE | ... |
|---|---|---|---|---|
| $100_1$ | PROC1 | 2005-11-01 | k1~k20 | |
| $100_2$ | PROC2 | 2005-11-10 | k1~k20 | |
| $100_3$ | PROC3 | 2005-12-01 | k1~k20 | |
| $100_4$ | PROC4 | 2005-12-02 | k1~k20 | |
| $100_5$ | PROC5 | 2005-12-20 | k1~k20 | |
| . | | | | |
| . | | | | |
| . | | | | |

*Fig. 3C*

LOT NO.: 1

| PRESENT PROCESS | PREVIOUS PROCESS(X) | PREVIOUS PROCESS(Y) | GRID CORRECTION |
|---|---|---|---|
| PROC1 | | | |
| PROC2 | PROC1 | PROC1 | OFF |
| PROC3 | PROC1 | PROC2 | ON |
| PROC4 | PROC2 | PROC3 | ON |
| PROC5 | PROC2 | PROC1 | OFF |

EXPOSURE METHOD AND LITHOGRAPHY SYSTEM

CROSS REFERENCE TO RELATED APPLICATIONS

This application claims the benefit under 35 U.S.C. Section 371, of PCT International Application Number PCT/JP2006/310314 filed May 24, 2006 and claims foreign priority to Japanese Application No. 2005-152974 filed May 25, 2005, the contents of which are incorporated herein by reference.

TECHNICAL FIELD

The present invention relates to exposure methods and lithography systems, and more particularly to an exposure method and a lithography system that perform overlay exposure on a photosensitive object by overlaying layers.

BACKGROUND ART

In order to prevent reduction in the yield of the manufacturing line of microdevices such as semiconductor devices, it is essential to maintain the high overlay accuracy among the layers in overlay exposure in which shot areas are formed by transfer on a substrate such as a wafer (hereinafter, generally referred to as a "wafer") by overlaying multiple layers of circuit patterns and the like in the lithography process.

In addition, recently, in order to increase the productivity, a lithography system in which a plurality of projection exposure apparatuses are prepared and a host computer extensively controls the projection exposure apparatuses has been set up. In such a system, since circuit patterns of respective layers are transferred on one wafer using different projection exposure apparatuses in order to increase the productivity, the scheduling of the projection exposure apparatuses on the overlay exposure is required. For example, in the case where a projection exposure apparatus that is used for exposure in a previous process layer on a wafer (hereinafter, also simply referred to as a "previous process") is in operation, the entire exposure process can be shortened by conducting the scheduling so that another projection exposure apparatus that is not in operation at present is used for exposure of a present process layer (a current layer: hereinafter, also simply referred to as a "present process").

It is the difference in distortion of transferred image among projection exposure apparatuses that becomes a problem when executing such scheduling. In order to prevent electrical connection points of the circuits from relatively being displaced among layers due to the distortion difference among the apparatuses, it is required to secure the overlay accuracy of the images among layers. In order to secure the overlay accuracy of the images among layers, it is important to perform matching of such distortion among the projection exposure apparatuses.

In response to the increased requirement for the higher overlay accuracy in order to cope with the higher integration of semiconductor devices, as a system that performs this type of distortion matching among a plurality of projection exposure apparatuses, a lithography system has recently been proposed that aims at reducing as much as possible the shot shape error among layers caused by the difference of the image distortion correction capability among the apparatuses and/or change over time (e.g. refer to Patent Document 1).

In the lithography system described in Patent Document 1, as a principle, there is only one previous process layer that can be designated with respect to one present process layer, and even in the case where a plurality of previous process layers are designated, only the distortion matching, in which the average of distortion of the projected images in the previous process layers is assumed as a reference, is performed. However, in the actual circuit design, in the most cases, a layer that has a strong link with an electric wire extending in an X-axis direction, which is one of datum axes within a wafer surface, is different from a layer that has a strong link with an electric wire extending in a Y-axis direction in the circuit of the same layer. Accordingly, in such cases, it can be said that it is more desirable from the viewpoint of circuit design to make a distortion component in the X-axis direction conform to a distortion component of a layer that has a strong link with it and to make a distortion component in the Y-axis direction conform to another layer that has a strong link with it than to adjust distortion using the average of distortion of projected images in the previous process layers, and the like.

In order to cope with such cases, a method in which information used for alignment is separately detected for the X-axis and the Y-axis is also proposed, but it is the actual situation in which the specific realization means has not yet been proposed with regard to how to separately perform adjustment with respect to the X-axis and the Y-axis in the case where the overly exposure is performed also taking into consideration distortion of projected images and a nonlinear component of the array of shot areas formed on a wafer W by exposure.

Patent Document 1: Kokai (Japanese Unexamined Patent Application Publication) No. 2000-036451
Patent Document 2: Japanese Patent No. 2591746

DISCLOSURE OF INVENTION

Means for Solving the Problems

The present invention has been made in consideration of the situation described above, and according to a first aspect of the present invention, there is provided a first exposure method in which overlay exposure to a photosensitive object is performed by overlaying layers, the method including: a selection process in which a reference layer that serves as a reference to obtain information on overlay exposure of a next layer is selected for each of axes of a two-dimensional orthogonal coordinate system that serves as a reference on overlay, from among at least two layers that have been already exposed, wherein the information on overlay exposure includes a distortion component of a projected image at the point in time when exposure of the reference layer was performed, in a projection exposure apparatus that was used for the exposure of the reference layer.

With this method, since a reference layer for overlay exposure of a next layer is selected for each axis of the two-dimensional orthogonal coordinate system, distortion of a projected image can be adjusted per axis, assuming, as a reference, a distortion component of a projected image of the projection exposure apparatus at the point in time when exposure of the reference layer was performed that is included in the information on overlay exposure.

According to a second aspect of the present invention, there is provided a second exposure method in which overlay exposure to a photosensitive object is performed by overlaying layers, the method including: a selection process in which a reference layer that serves as a reference to obtain information on overlay exposure of a next layer is selected for each of axes of a two-dimensional orthogonal coordinate system that serves as a reference on overlay, from among at least two layers that have been already exposed, wherein the information on overlay exposure includes a nonlinear component of a positional deviation amount of formation positions of a plurality of divided areas with respect to positions, which serve as datum positions when the plurality of divided areas are formed on the photosensitive object, in a projection exposure apparatus that was used for exposure of the reference layer.

With this method, a reference layer for overlay exposure of a next layer is selected for each axis of the two-dimensional orthogonal coordinate system, and therefore, by assuming, as a reference, a nonlinear component of a positional deviation amount of a formation position of each of a plurality of divided areas in the projection exposure apparatus that was used for exposure of the reference layer included in the information on overlay exposure, the nonlinear component can be adjusted per axis.

According to a third aspect of the present invention, there is provided a first lithography system that performs overlay exposure to a photosensitive object by overlaying layers, the system comprising: a plurality of projection exposure apparatuses; a storage unit that stores information on a formation state of a pattern image of a layer that has been already exposed by any one of the plurality of projection exposure apparatuses; a first selection unit that selects a reference layer that serves as a reference to obtain information on overlay exposure of a next layer for each of axes of a two-dimensional orthogonal coordinate system that serves as a reference on overlay, from among at least two layers that have been already exposed, the information on overlay exposure including a distortion component of a projected image at the point in time when exposure of the reference layer was performed, in a projection exposure apparatus that was used for the exposure of the reference layer; a second selection unit that selects a projection exposure apparatus that performs overlay exposure of a next layer from among the plurality of projection exposure apparatuses; and a computation unit that computes information on overlay exposure of a next layer in the selected projection exposure apparatus based on information on an exposure state of the selected reference layer for each of the axes.

With this system, since a reference layer for overlay exposure of a next layer is selected for each axis of the two-dimensional orthogonal coordinate system, distortion of a projected image can be adjusted per axis, assuming, as a reference, a distortion component of a projected image of the projection exposure apparatus at the point in time when exposure of the reference layer was performed that is included in the information on overlay exposure.

According to a fourth aspect of the present invention, there is provided a second lithography system that performs overlay exposure to a photosensitive object by overlaying layers, the system comprising: a plurality of projection exposure apparatuses; a storage unit that stores information on a formation state of a pattern image of a layer that has been already exposed by any one of the plurality of projection exposure apparatuses; a first selection unit that selects a reference layer that serves as a reference to obtain information on overlay exposure of a next layer for each of axes of a two-dimensional orthogonal coordinate system that serves as a reference on overlay, from among at least two layers that have been already exposed, the information on overlay exposure including a nonlinear component of a positional deviation amount of formation positions of a plurality of divided areas with respect to positions, which serve as datum positions when the plurality of divided areas are formed on the photosensitive object, in a projection exposure apparatus that was used for overlay exposure of the reference layer; a second selection unit that selects a projection exposure apparatus that performs overlay exposure of a next layer from among the plurality of projection exposure apparatuses; and a computation unit that computes information on overlay exposure of a next layer in the selected projection exposure apparatus based on information on an exposure state of the selected reference layer for each of the axes.

With this system, a reference layer for overlay exposure of a next layer is selected for each axis of the two-dimensional orthogonal coordinate system, and therefore, by assuming, as a reference, a nonlinear component of a positional deviation amount of a formation position of each of a plurality of divided areas of the projection exposure apparatus that was used for exposure of the reference layer included in the information on overlay exposure, the nonlinear component can be adjusted per axis.

BRIEF DESCRIPTION OF THE DRAWINGS

FIG. 3A is a view showing an example of database of image distortion data, FIG. 3B is a view showing an example of an exposure history list, and FIG. 3C is a view showing an example of a process program.

BEST MODE FOR CARRYING OUT THE INVENTION

An embodiment of the present invention will be described below, referring to FIGS. 1 to 11.

Figure 1:
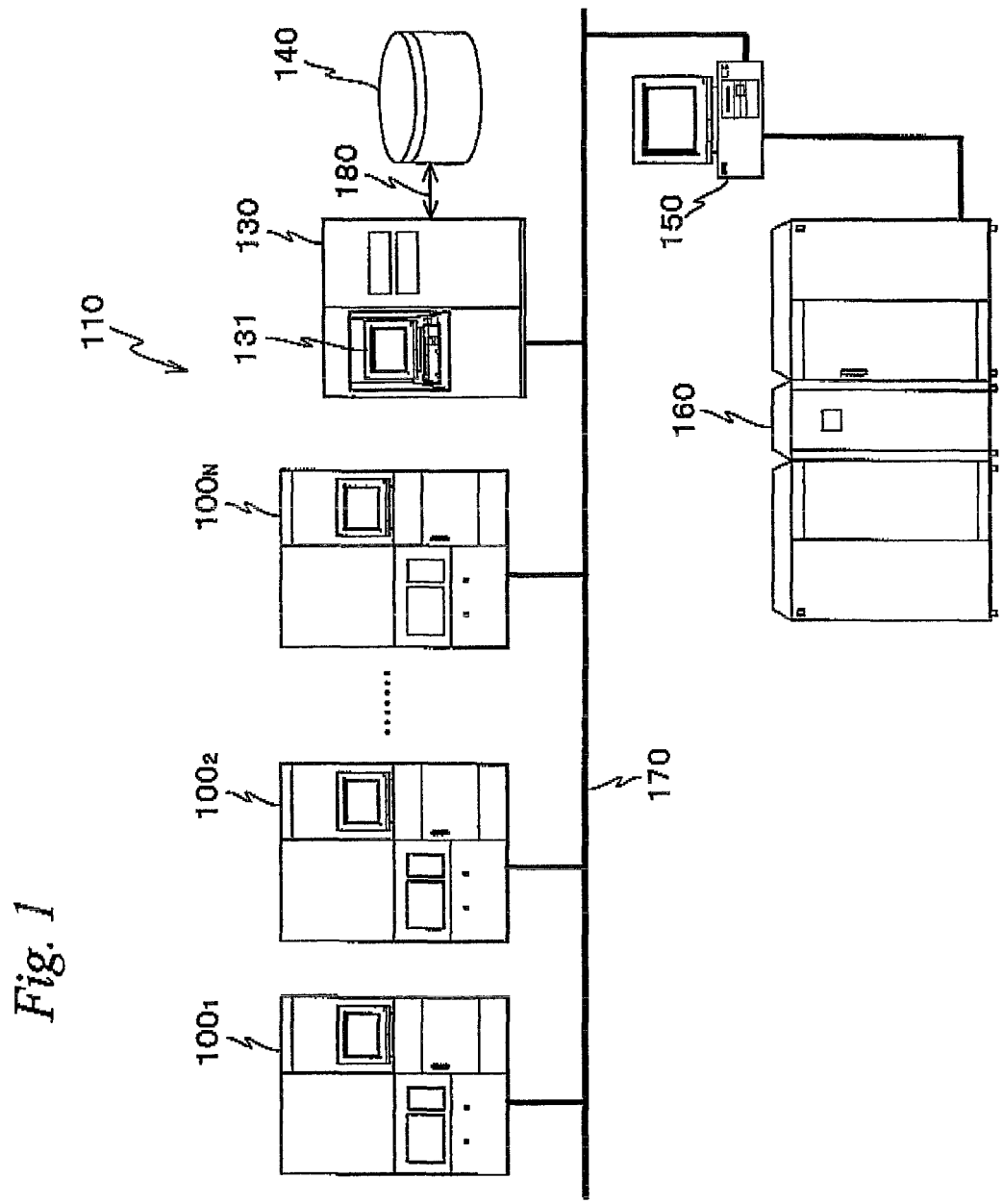
FIG. 1 is a view schematically showing a configuration of a lithography system in an embodiment of the present invention.

FIG. 1 schematically shows the configuration of a lithography system 110 related to an embodiment of the present invention. Lithography system 110 is equipped with N numbers of projection exposure apparatuses $100_1$ to $100_N$, an information central server 130, a storage unit 140, a terminal server 150, a host computer system 160 and the like.

Among these constituents, each projection exposure apparatus $100_i$ (i=1, 2, ..., N), information central server 130 and terminal server 150 are connected to a local area network (LAN) 170. Further, storage unit 140 is connected to information central server 130 via a communication line 180 such as a small computer system interface (SCSI). Further, host computer system 160 is connected to LAN 170 via terminal server 150. That is, in terms of a hardware configuration, communication routes between each projection exposure apparatus $100_i$ (i=1, 2, ..., N), information central server 130 (and storage unit 140), terminal server 150, and a host computer system 160 are secured.

Each of projection exposure apparatuses $100_1$ to $100_N$ may be a projection exposure apparatus by a step-and-repeat-method, which is a so-called stepper (hereinafter, referred to as "static exposure apparatus"), or may be a projection exposure apparatus by a step-and-scan-method, that is, a scanning stepper (hereinafter, referred to as 'scanning exposure apparatus'). In the embodiment, for the sake of simplicity of the description, all of N numbers of projection exposure apparatuses $100_1$ to $100_N$ are to have adjusting capability of distortion of projected images and also be scanning exposure apparatuses.

Figure 2:
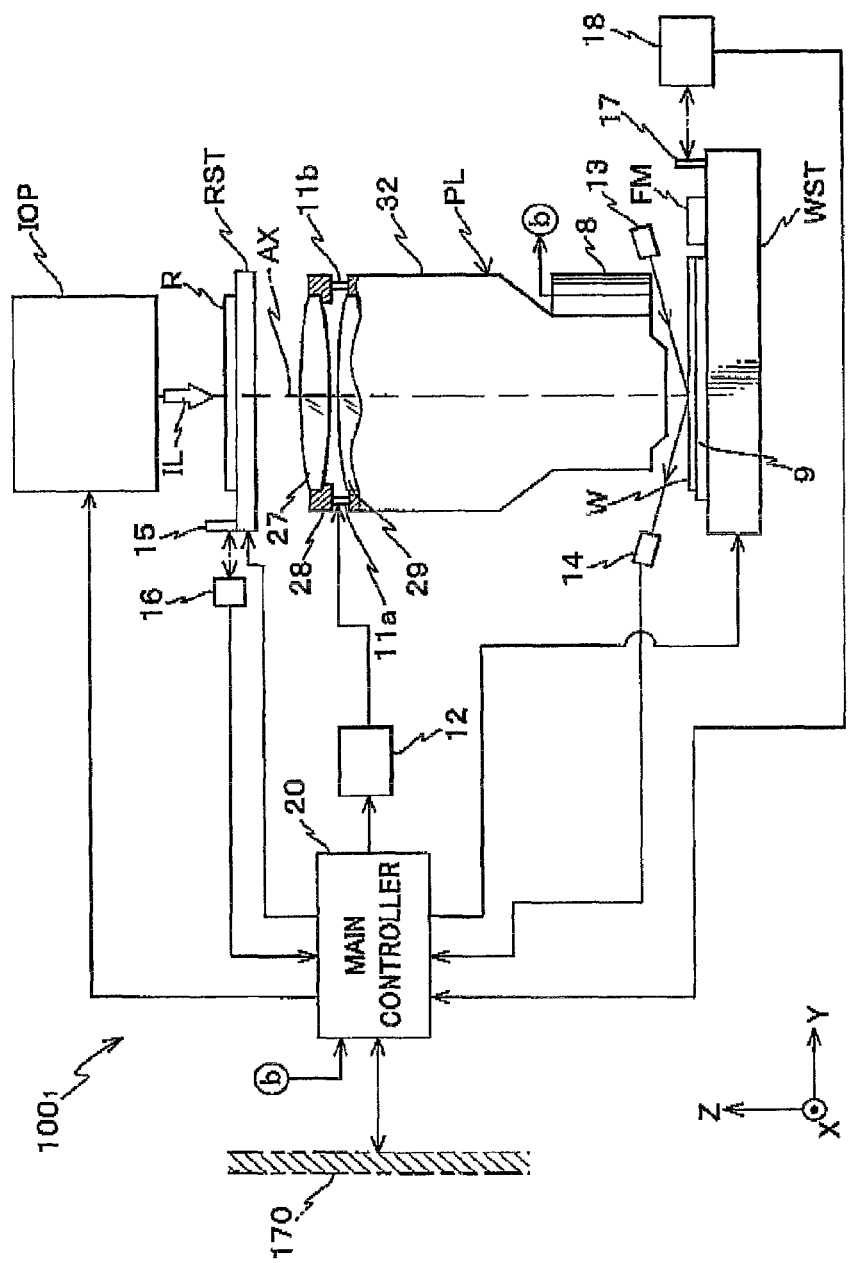
FIG. 2 is a view showing a schematic configuration of a projection exposure apparatus $100_1$ in FIG. 1.

FIG. 2 shows the schematic configuration of projection exposure apparatus $100_1$ that is one of the projection exposure apparatuses in FIG. 1. As is shown in FIG. 2, projection exposure apparatus $100_1$ is equipped with an illumination system IOP, a reticle stage RST that holds a reticle R, a projection optical system PL, a wafer stage WST on which wafer W is mounted and the like.

Illumination system IOP is equipped with a light source and an illumination optical system. The illumination optical system is configured including an illuminance uniformizing optical system including an optical integrator (such as a fly-eye lens, an internal reflection type integrator (rod integrator), or a diffraction optical element), a relay lens, a variable ND filter, a reticle blind (a field stop that is also called a masking blade), a relay optical system including a condenser lens, and the like (none of which are shown). The configuration of the illumination system similar to that of the embodiment is disclosed in, for example, Kokai (Japanese Unexamined Patent Application Publication) No. 2001-313250 (the corresponding U.S. Patent Application Publication No. 2003/0025890) and the like. As long as the national laws in designated states (or elected states), to which this international application is applied, permit, the above disclosures of the publication and the U.S. Patent Application Publication are incorporated herein by reference.

In illumination system IOP, illumination light IL illuminates a slit-shaped (elongated rectangular shape extending in the X-axis direction) illumination area that is defined by the reticle blind on reticle R, on which a circuit pattern and the like are drawn, with substantially uniform illuminance. As illumination light IL, for example, a far-ultraviolet light such as a KrF excimer laser light (wavelength: 248 nm), a vacuum ultraviolet light such as an ArF excimer laser light (wavelength: 193 nm) or an $F_2$ laser light (wavelength: 157 nm), or the like is used. Incidentally, as illumination light IL, a pulsed laser light such as an $Ar_2$ laser light (wavelength: 126 nm) or a $Kr_2$ laser light (wavelength: 146 nm), or an emission line (such as a g-line or an i-line) of ultraviolet region from an extra-high pressure mercury lamp, or the like may also be used. Further, a harmonic wave generating unit of a YAG laser or the like can also be used. Besides, a harmonic wave, which is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a non-linear optical crystal, may also be used.

On reticle stage RST, reticle R is fixed by, for example, vacuum suction. Reticle stage RST is finely drivable in the X-axis direction, the Y-axis direction and a θz direction (a rotation direction around a Z-axis) within an XY plane perpendicular to an optical axis of the illumination optical system (which coincides with an optical axis AX of projection optical system PL to be described later) and is also drivable at a designated scanning velocity in a predetermined scanning direction (to be the Y-axis direction, in this case), by a reticle stage drive section (not shown) composed of a linear motor or the like. The position of reticle stage RST within a stage-moving plane is constantly measured at a resolution of, for example, approximately 0.5 to 1 nm by a reticle laser interferometer (hereinafter, referred to as a "reticle interferometer") 16 via a movable mirror 15. Position information of reticle stage RST from reticle interferometer 16 is sent to a main controller 20, and main controller 20 controls reticle stage RST via the reticle stage drive section (not shown) based on the position information of reticle stage RST.

Projection optical system PL is placed below reticle stage RST in FIG. 2, and the direction of optical axis AX of projection optical system PL is a Z-axis direction. As projection optical system PL, for example, a both-side telecentric dioptric system is used in this case, which is composed of a plurality of lens elements 27 and 29 and a plurality of other lens elements placed at a predetermined distance along an optical axis AX direction inside a barrel 32. The projection magnification of projection optical system PL is for example, ⅕ (or ¼), and a reduced image of a circuit pattern is projected on an exposure area that is conjugate with the illumination area with respect to projection optical system. PL. Therefore, when the illumination area on reticle R is illuminated with illumination light IL from illumination system IOP, illumination light IL passing through reticle R forms a reduced image (partially inverted image) of a circuit pattern on reticle R within the illumination area on wafer W which surface is coated with a resist (photosensitive agent), via projection optical system PL. In projection exposure apparatus $100_1$, an image-forming characteristic correction unit that corrects the distortion (including the magnification) of projected images by projection optical system PL is arranged.

The image-forming characteristic correction unit will be described next. The image-forming characteristic correction unit corrects variation in image-forming characteristics of projection optical system PL itself due to the change in atmospheric pressure, illumination light absorption, and the like, and also has the action of making a projected image of a pattern of reticle R be distorted in accordance with distortion of an image of a pattern that was transferred to a shot area of a preceding specific layer (e.g. a previous layer) on wafer W. As the image-forming characteristics of projection optical system PL, there are a projection magnification, a focal position, curvature of field, distortion, astigmatism, comma, spherical aberration and the like. In the embodiment, although the image-forming characteristics except for the focal position can be corrected, for example, by movement of the lens elements of projection optical system PL, the image-forming characteristic correction unit is assumed to mainly perform only correction of distortion (including magnification) of projected images in the following description.

In FIG. 2, lens element 27 constituting projection optical system PL that is closest to reticle R (on the most object plane side) is held by an annular-shaped holding member 28. Holding member 28 is supported on the upper surface of an annular-shaped holding member that holds lens element 29, via a plurality of (three in this case) drive elements that are freely extendable/contractible, for example, piezo elements 11a, 11b and 11c (however, piezo element 11c located in the depth of the page surface is not shown in FIG. 2). The configuration is employed in which the drive voltage applied to drive elements 11a, 11b and 11c is independently controlled by an image-forming characteristic control section 12, and with this control, lens element 27 can arbitrarily incline with respect to a plane orthogonal to optical axis AX and move in the optical axis AX direction.

Lens element 29 next to lens element 27 can arbitrarily incline with respect to a plane orthogonal to optical axis AX and be driven in the optical axis AX direction by a plurality of drive elements similarly to lens element 27.

Incidentally, in the embodiment, only lens elements 27 and 29 are individually movable within barrel 32 of projection optical system PL, but three or more lens elements may also be movable, or a lens group that integrally holds at least two lens elements may also be movable.

The positions of lens elements 27 and 29 are accurately measured by a position sensor (not shown), and the positions of lens elements 27 and 29 are maintained at the target positions by image-forming characteristic control section 12 controlling a drive amount of each drive element based on the measurement results in response to instructions of main controller 20.

In projection exposure apparatus $100_1$, holding member 28 of lens element 27, the holding member of lens element 29, a plurality of the drive elements (such as 11a, 11b, and 11c), and image-forming characteristic control section 12 that controls the drive voltage to each of the drive elements constitute the image-forming characteristic correction unit (having a magnification adjustment function). Incidentally, optical axis AX of projection optical system PL denotes an optical axis shared by lens elements fixed to barrel 32.

Image-forming characteristic control section 12 can adjust image-forming characteristics (distortion of projected images) of the projection optical system not only by performing drive control of the lens elements via the drive elements described above, but also by shifting the center wavelength of illumination light IL by controlling the light source.

Wafer stage WST placed below projection optical system PL in FIG. 2 is supported by levitation via a predetermined clearance above a base (not shown) by a hydrostatic air bearing (not shown) arranged on the bottom surface of wafer stage WST, and can be freely driven in the X-axis direction and the Y-axis direction by a wafer stage drive section (not shown) including an actuator such as a linear motor or the like, and also can be finely driven in the Z-axis direction, the θz direction, a θx direction (rotation direction around an X-axis) and a θy direction (rotation direction around a Y-axis).

A wafer holder 9 having a substantially circular shape is arranged on wafer stage WST, and wafer W is held on wafer holder 9 by vacuum suction so as to be flat. Wafer holder 9 is composed of low-thermal-expansion materials in order to suppress deformation by expansion due to thermal accumulation on exposure of wafer W.

The position of wafer stage WST within the XY plane is constantly measured at a resolution of, for example, approximately 0.5 to 1 nm by a wafer laser interferometer (hereinafter, referred to as a "wafer interferometer") 18 via a movable mirror 17. Position information (or velocity information) of wafer stage WST is sent to main controller 20, and main controller 20 controls wafer stage WST via a wafer stage drive section (not shown) based on the position information (or velocity information).

In actual, as the movable mirror on wafer stage WST, an X movable mirror having a reflection surface orthogonal to the X-axis and a Y movable mirror having a reflection surface orthogonal to the Y-axis are arranged, and as wafer laser interferometers corresponding to theses movable mirrors, an X laser interferometer for X-axis direction position measurement and a Y laser interferometer for Y-axis direction position measurement are arranged. In FIG. 2, however, movable mirror 17 and wafer laser interferometer 18 are representatively shown. Further, the X laser interferometer and the Y laser interferometer are multiaxial interferometers having a plurality of measurement axes, and can measure the rotation (yawing (θz rotation being a rotation around the Z-axis), pitching (θx rotation being a rotation around the X-axis) and rolling (θy rotation being a rotation around the Y-axis)), in addition to the X and Y positions of wafer stage WST. Accordingly, in the following description, the position of wafer stage WST in directions of five degrees of freedom, which are the X, Y, θz, θy and θx directions, is to be measured by wafer interferometer 18. Further, the multiaxial interferometer may irradiate a laser beam to a reflection surface arranged at a frame (not shown) on which projection optical system PL is mounted via a reflection surface arranged being inclined at an angle of 45 degrees on wafer stage WST, and detect relative positional information in the optical axis direction (Z-axis direction) of projection optical system PL.

Further, to the upper surface of wafer stage WST, a fiducial mark plate FM whose surface is set to the substantially same height as the wafer W surface is fixed. On the surface of fiducial mark plate FM, fiducial marks for baseline measurement of an alignment sensor (to be described later), fiducial marks for reticle alignment, and the like are formed in a predetermined positional relation.

An alignment detection system by an off-axis method used to detect the positions of alignment marks (wafer marks) arranged in each shot area on wafer W, for example, an alignment sensor 8 by an image processing method is arranged on the side surface of projection optical system PL. Alignment sensor 8 is an FIA (Field Image Alignment) system sensor by an image processing method that irradiates a broadband detection beam that does not expose the resist on wafer W to a subject mark, and picks up an image of the subject mark formed on the light-receiving surface by a reflected light from the subject mark and an image of an index (not shown) using an imaging device (such as CCD), and then outputs their imaging signals. Incidentally, alignment sensor 8 is not limited to the FIA system, but an alignment sensor, which irradiates a coherent detection light to a subject mark and detects a scattered light or a diffracted light generated from the subject mark or makes two diffracted lights (e.g. diffracted lights of the same order) generated from the subject mark interfere and detects an interference light, can naturally be used alone or in combination as needed. The detection results of alignment sensor 8 are output to main controller 20 via an alignment signal processing system (not shown).

Further, in projection exposure apparatus $100_1$, a multipoint focal position detection system by an oblique incident method is arranged, which is composed of: an irradiation system 13 that supplies image-forming beams for forming a plurality of slit images toward the best image-forming plane of projection optical system PL from the oblique direction with respect to the optical axis AX direction; and a photodetection system 14 that receives each of reflected beams of the image-forming beams that are reflected off the surface of wafer W via each of the slits. As the multipoint focal position detection system (13, 14), the configuration similar to the one disclosed in, for example, Kokai (Japanese Unexamined Patent Application Publication) No. 06-283403 is used. Wafer position information detected by the multipoint focal position detection system (13, 14) is supplied to main controller 20. Main controller 20 drives wafer stage WST in the Z-axis direction and the inclination direction via the wafer stage drive section based on the wafer position information, and performs focus-leveling control of wafer W.

Main controller 20 is composed of, for example, a microcomputer, and performs the overall control of the respective constituents of projection exposure apparatus $100_1$. Further, in the embodiment, main controller 20 also controls a coater developer (not shown, hereinafter, referred to as "C/D") that is arranged together with projection exposure apparatus $100_1$. Further, main controller 20 is connected to LAN 170.

Projection exposure apparatuses $100_2$, $100_3$, ... $100_N$ which are other scanning exposure apparatuses are similarly configured to projection exposure apparatus $100_1$ described above.

Referring back to FIG. 1, main controller 20 constituting projection exposure apparatus $100_i$ performs communication with host computer system 160 via LAN 170 and terminal server 150, and executes the various types of control operations in response to instructions from host computer system 160.

Information central server 130 is a support unit of the lithography system that is composed of a medium-scale computer system (e.g. a minicomputer system or an engineering workstation system) that is excellent in computation capability. Information central server 130 performs communication with host computer system 160 via LAN 170 and terminal server 150, in addition to communication with projection exposure apparatuses $100_1$ to $100_N$ via LAN 170.

Further, when performing communication with projection exposure apparatuses $100_1$ to $100_N$ and the like, information central server 130 reads/writes data with respect to storage unit 140 as needed. Incidentally, in information central server 130, an input/output unit 131 that includes a display being a man-machine interface to an operator, a pointing device such as a keyboard or a mouse, and the like is arranged. Further, an external drive unit (not shown) of information recording medium such as CD (Compact Disc), DVD (Digital Versatile Disc), MO (Magneto-optical Disc) or FD (Floppy Disc) is connected to information central display 130. In the information recording medium (hereinafter, which is to be a CD) that is set on the drive unit, the programs corresponding to the processing algorithms shown in FIGS. 5, 6 and 7, other programs, and database pertaining to these programs are recorded.

Information central server 130 registers distortion data of projected images (to be described later) that is periodically sent from each projection exposure apparatus $100_i$ (i=1 to N) in a database within storage unit 140.

Terminal server 150 is composed as a gateway processor used to absorb the differences between the communication protocol in LAN 170 and the communication protocol in host computer system 160. The function of terminal server 150 allows the communication between host computer system 160 and projection exposure apparatuses $100_1$ to $100_N$, information central server 130 and the like that are connected to LAN 170.

Host computer system 160 is a manufacturing control system (MES: Manufacturing Execution System) that is configured including a large-sized computer. Herein, the Manufacturing Control System (MES) is a system that controls and analyzes all the processes, equipments, conditions and operational data of the respective products that flow in the production lines, thereby improving the quality and yield and reducing operational errors to support the more efficient production. Incidentally, host computer system 160 may be other systems than the MES, and for example, a dedicated computer may also be used. Hereinafter, host computer system 160 is to be referred to as host 160.

As LAN 170, although either of a bus type LAN or a ring type LAN can be employed, a bus type LAN by a carrier sense multiple access/collision detection (CSMA/CD) method of IEEE802 standard is used in the embodiment. In lithography system 110, the communication among the apparatuses is performed via LAN 170 and terminal server 150, but this will not specifically be described hereinafter.

<Distortion Measurement of Projected Image>

In lithography system 110, measurement of distortion of a projected image (distortion) of a pattern in each projection exposure apparatus $100_i$ and computation of image distortion data (distortion data) based on the measurement results are periodically performed, taking into consideration the image-forming characteristics in projection optical system PL of each projection exposure apparatus $100_i$. Measurement of distortion of a projected image in each projection exposure apparatus $100_i$ is performed at two stages, that is, in exposure using a test reticle and in measurement of a resist image (transferred image) on the wafer to which exposure has been finished.

On the test reticle, two-dimensional measurement marks are placed in the matrix arrangement within the pattern area. In exposure using the test reticle, transfer is performed to different shot areas on wafer W under all the set exposure conditions while changing the exposure condition. When performing this operation, a correction amount of distortion of a projected image by the image-forming characteristic correction unit is assumed to be zero. When the transfers under all the exposure conditions are finished, main controller 20 carries wafer W on the wafer holder to the C/D (not shown) using a wafer carriage system (not shown). Then, the C/D performs development of the wafer W, and after the development, resist images of the two-dimensional measurement marks are formed in different shot areas on wafer W.

Next, main controller 20 loads the wafer W to which the development is finished onto the wafer holder again using the wafer carriage system, and then, measures the position coordinates of the resist images of the measurement marks formed in a plurality of shot areas on wafer W using the measurement values of alignment sensor 8 and the corresponding measurement values of wafer interferometer 18. Then, based on the difference between the measurement results and the design position coordinates in an ideal coordinate system (shot coordinate system) whose origin is set at the datum point of each shot area, for example, at the center point of each shot area, main controller 20 obtains the positional deviation amount of the resist image of each measurement mark per shot area (i.e. per exposure condition).

Then, abnormal value data exceeding a predetermined permissible value is excluded from data (raw data) of the measured positional deviation amount, and the average value of the positional deviation amount after the exclusion of the abnormal value data is excluded from the total positional deviation amount assuming the average value as the center shift amount (center shift correction). Subsequently, the reticle manufacturing error (including a pattern drawing error and the like) is excluded from the positional deviation amount to which the center shift correction has been finished as is described above (reticle manufacturing error correction).

Then, the alignment mark manufacturing error is excluded from the positional deviation amount in which the reticle manufacturing error has been corrected (alignment mark manufacturing error correction). Next, a reticle rotation amount is excluded from the positional deviation amount in which the alignment mark manufacturing error has been corrected (reticle rotation correction).

Data on the positional deviation amount obtained in this manner is referred to as image distortion data in the following description. Main controller 20 obtains the image distortion data for each exposure condition, and transmits the data together with data on each measurement time to information central server 130. Information central server 130 registers these data in the database within storage unit 140.

The measurement of image distortion data similar to the above-described measurement is periodically performed also in other projection exposure apparatuses $100_2$, $100_3$, . . . , $100_N$, and the measurement results are sent to information central server 130, and information central server 130 registers the measurement results in the database within storage unit 140. That is, the image distortion data is registered for each projection exposure apparatus, each measurement date and time and each exposure condition in the database of storage unit 140. Herein, since the exposure conditions are registered in the database in a state where ID is assigned to each exposure condition, in the following description, the ID per exposure condition is also described as exposure ID.

Further, the processing after the formation of resist images of measurement marks formed under all of the set different exposure conditions in each exposure projection apparatus as is described above does not always have to be performed by main controller 20, but may be performed by information central server 130 and the like, or by another measurement unit. Further, the image distortion data described above may also be obtained using the reference wafer method.

FIG. 3A shows an example of part of the database of image distortion data that have been periodically measured. In FIG. 3A, the distortions of projected images of projection exposure apparatuses $100_1$ to $100_5$ measured in the beginning of November, 2005 and in the beginning of December, 2005 are registered. In the embodiment, the measurement of image distortion data of projection exposure apparatus $100_i$ is to be performed monthly.

<Exposure History Data>

Further, in lithography system 110, the communication is performed between main controller 20 of each projection exposure apparatus $100_i$ (i=1 to N) and host 160 at the time of exposure process end, and along with a notice of exposure end, exposure history data of corresponding projection exposure apparatus $100_i$ is sent from main controller 20 to host 160, and further sent from host 160 to information central server 130, and information central server 130 registers it in the database within storage unit 140. This database is called exposure history database. The exposure history data includes information on the name of an apparatus that performs the exposure processing in the process, the name of the process, the processing date and time, the image distortion correction value, the exposure ID and the like. FIG. 3B shows an example of a lot history list that is created as will be described later based on the lot history that has been obtained from the exposure history database.

<Wafer Grid>

The shot areas on wafer W are formed in the matrix arrangement according to the shot map of the process program. When connecting the shot centers of adjacent shot areas formed on wafer W using a straight line, a two-dimensional grid can be drawn. In the following description, the two-dimensional grid is referred to as a wafer grid. By using the wafer grid, the positional error among a plurality of shot areas that have already been formed on the wafer with respect to the design positions, that is, the so-called inter-shot error can be expressed. In this regard, the intra-shot error, which is an error due to deformation of the shot area itself and is caused by the distortion of the projected image described above and the like, is excluded from the inter-shot error.

The inter-shot error includes a so-called first-order component (i.e. a linear component) such as a wafer magnification error, a wafer orthogonality degree error and a wafer rotation error, and a high-order (second or higher-order) component (i.e. a nonlinear component). In this case, the first-order component is a component that can be approximated in the first-order term of the coordinate axes X and Y of the stage coordinate system (XY coordinate system), and the high-order component is a component that can be approximated by the mathematical function that can be expressed by the linear coupling of terms in which $X^2$, $XY$, $Y^3$, $X^3$, $X^2Y$, $XY^2$ and $Y^3$ are used as independent variables respectively.

As a main factor causing the nonlinear component to generate at the wafer grid, there is the attribute of an exposure apparatus used for exposure of the wafer, for example, the orthogonality of wafer stage WST and the nonlinearity of position control of wafer stage WST (so-called stage grid).

Thus, in projection exposure apparatuses $100_1$ to $100_N$, a grid correction function that cancels the deviation of the stage grid among the apparatuses, that is, performs so-called inter-apparatus matching is arranged. The inter-apparatus matching by the grid correction function is performed using a correction map that is a map showing nonlinear components of positional deviation amounts of the shot centers of shot areas.

The correction map in the grid correction function is created in the procedures: creation of a reference wafer, measurement of marks on the reference wafer, and creation of the correction map based on mark measurement results, and the specific method is disclosed in detail in the U.S. Patent Application Publication No. 2002/0042664 described above and is publicly known, and therefore, the detailed description will be omitted herein. As long as the national laws in designated states (or elected states), to which this international application is applied, permit, the above disclosure of the U.S. Patent Application Publication is incorporated herein by reference.

The correction map is created based on a nonlinear component of the positional deviation amount of the center of each shot area that is extracted by wafer alignment by the EGA (to be described later) when a reference wafer is loaded in each of projection exposure apparatuses $100_1$ to $100_N$. That is, the correction map is on the basis of the reference wafer. Further, in this case, the correction map is severally created for each of all the combinations of sample shot areas when performing the EGA (to be described later) (shot areas whose position coordinates are measured in the EGA). That is, the correction map is created in a file format for each projection exposure apparatus and for each combination of sample shot areas. The correction map files are stored by information central server 130 in storage unit 140, and registered in the database in storage unit 140. By referring to the database using the name of apparatus, the combination of sample shot areas, and the like as keys, information central server 130 can search a file name of the correction map file that satisfies the conditions, and the correction map file can be read out using the file name.

<<Exposure Process (Steps)>>

Figure 4:
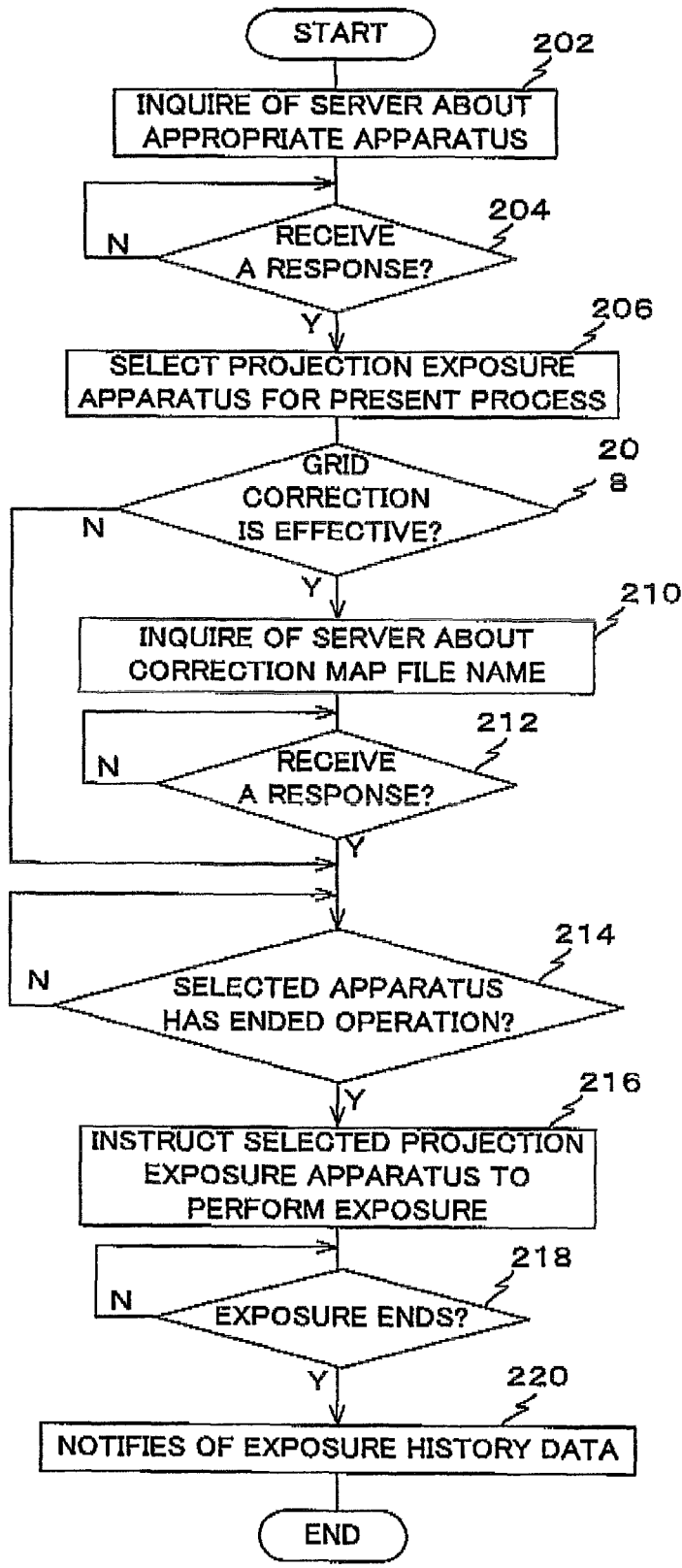
FIG. 4 is a flowchart showing a processing algorithm of a host computer system that constitutes the lithography system in an embodiment of the present invention.
Figure 5:
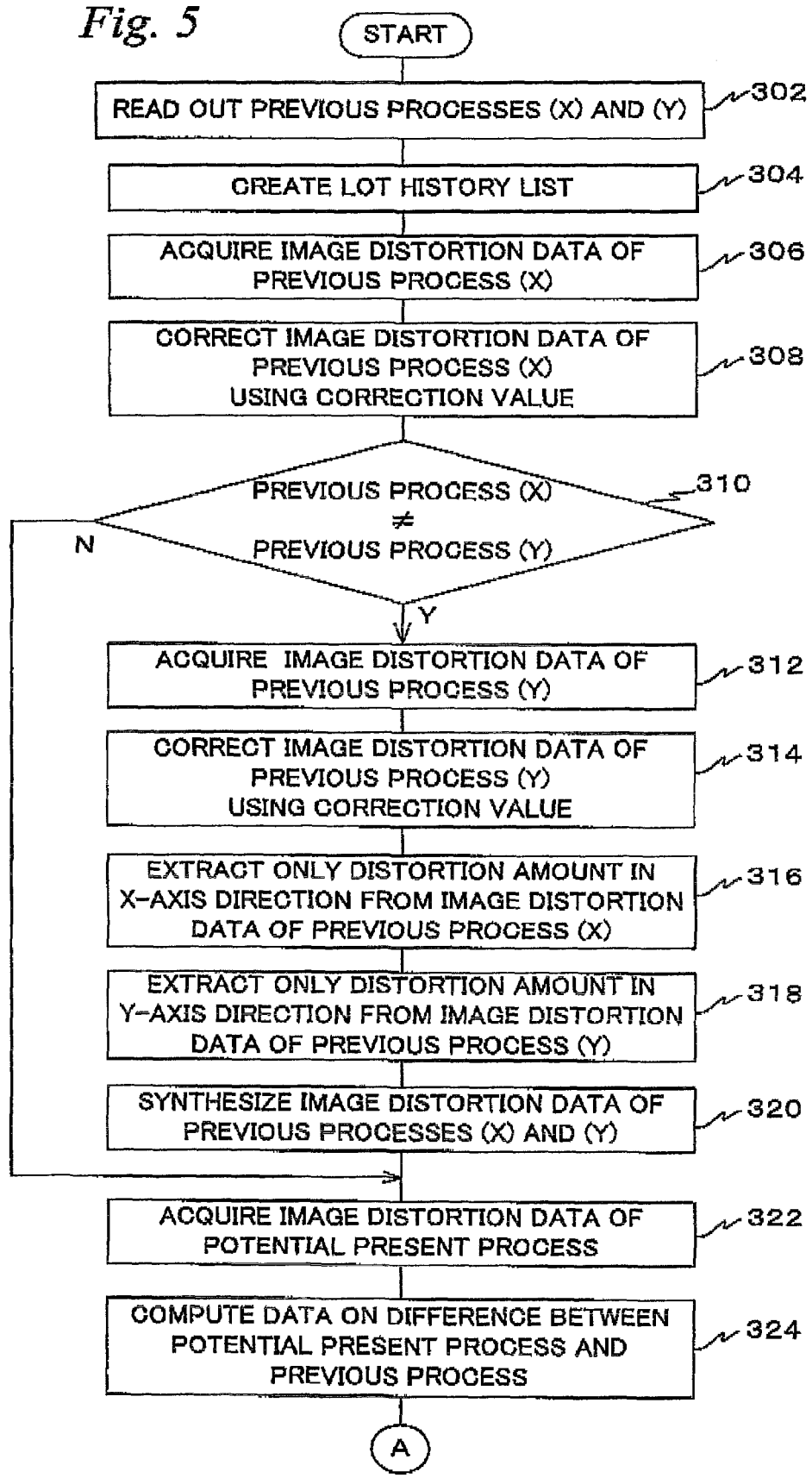
FIG. 5 is a flowchart showing a processing algorithm (No. 1) of an information central server that constitutes the lithography system in an embodiment of the present invention.
Figure 6:
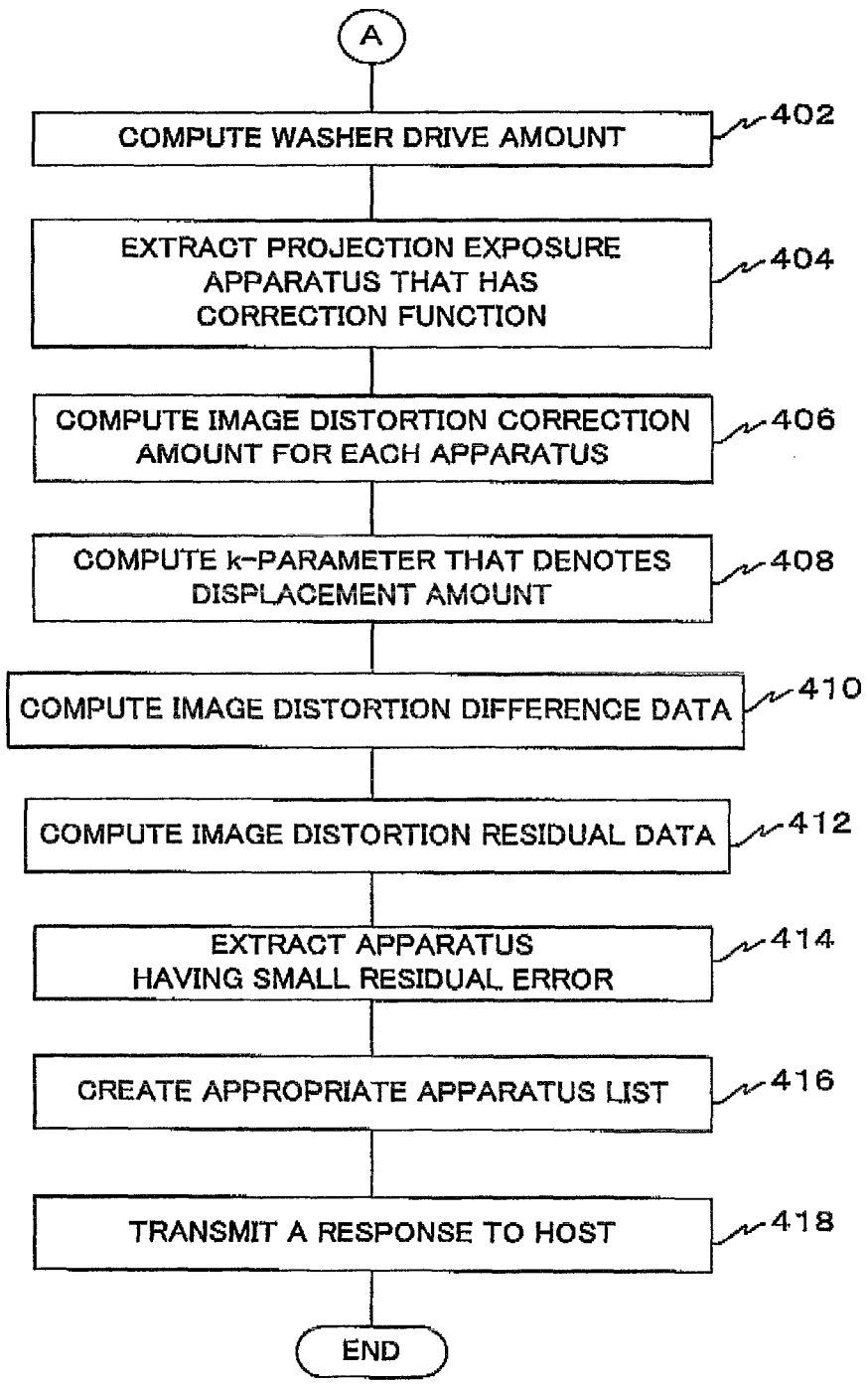
FIG. 6 is a flowchart showing a processing algorithm (No. 2) of the information central server that constitutes the lithography system in an embodiment of the present invention.
Figure 7:
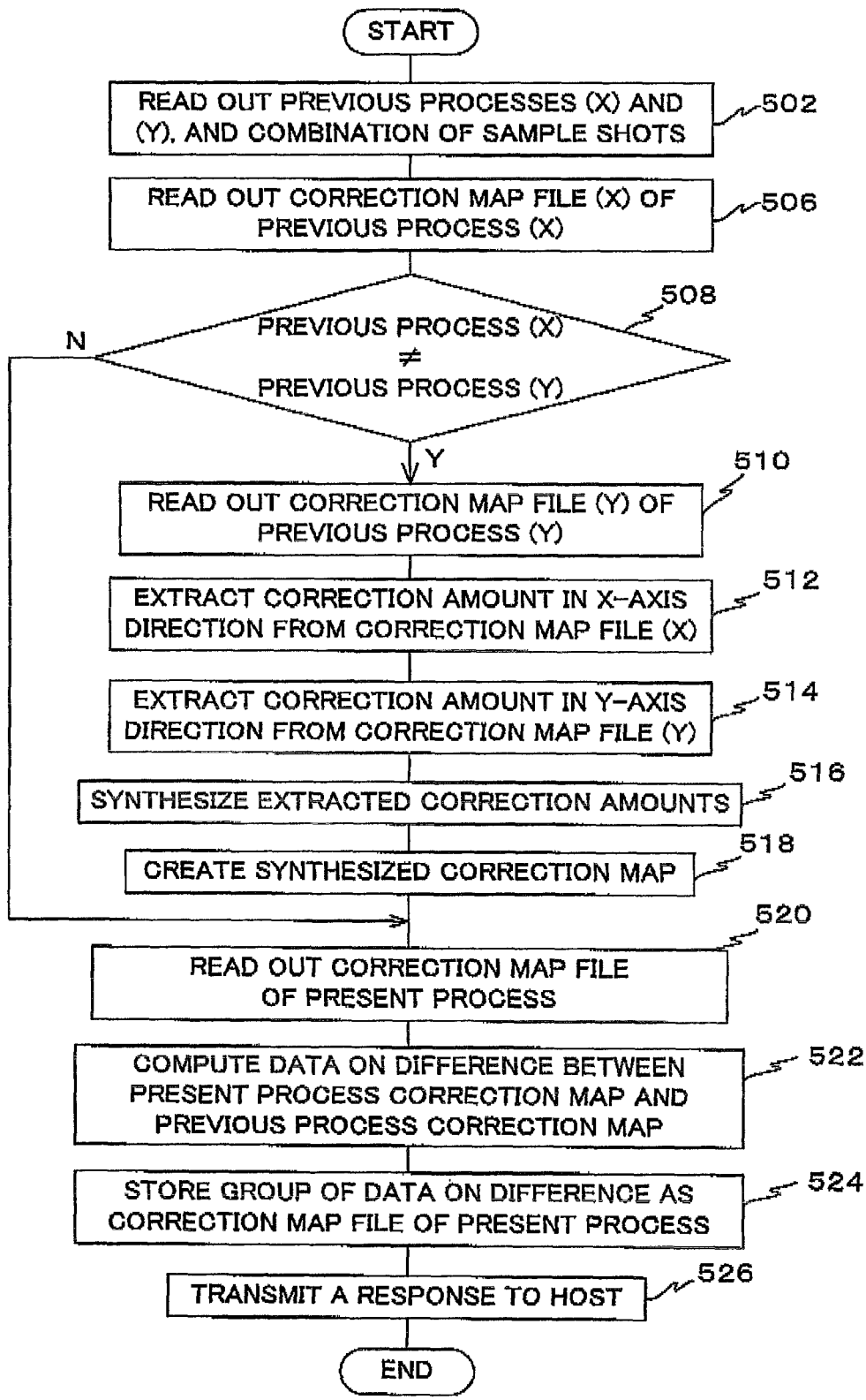
FIG. 7 is a flowchart showing a processing algorithm (No. 3) of the information central server that constitutes the lithography system in an embodiment of the present invention.

Next, the operations of the respective constituents in the exposure process (steps) of wafer W by lithography system 100 of the embodiment having the above-described configured will be described based on FIGS. 4 to 7. FIG. 4 shows a flowchart showing a processing algorithm of host 160, and FIGS. 5, 6 and 7 show a flowchart of a processing algorithm of information central server 130 respectively.

<Process Program>

Wafers W subject to exposure in lithography system 110 are divided into groups each having a plurality of wafers W. These groups are called lots. In the embodiment, wafers W are to be processed per lot in lithography system 110 for the sake of simplification of the description. Host 160 has process program files in which the process programs (processes per product) to be performed in lithography system 110 are written. In the embodiment, for the sake of simplification of the description, the following description will be made on the assumption that the process program file is prepared for each lot and the exposure condition (exposure ID) that is set in each projection exposure apparatus $100_i$ is only one. The process program files are stored in a storage unit (not shown) within host 160.

Wafers W in a lot are processed based on the process program written in the process program file. An example of the contents of the process program is shown in FIG. 3C. As is shown in FIG. 3C, the identifier (lot No.) of the lot is designated in the process program (P.P.) and "1" is designated as the lot No. in this case. Moreover, information on the present process is included. The present process is a process that corresponds to a layer to be exposed next. In the process program shown in FIG. 3C, PROC1 to PROC5 are registered as the present process. In this process program, PROC1 is information on processes of the first layer of the lot, PROC2 to PROC5 is information on processes of the second to fifth layers respectively.

As is shown in FIG. 3C, in the process program, information on the process of each layer described above, that is, the previous process (X) and the previous process (Y) corresponding to PROC1 to PROC 5 in the present process respectively are also described. The previous process is a process in which a layer for reference (reference layer) was exposed that becomes the reference of the overlay when the overlay exposure of a layer of the present process is performed. In the embodiment, the previous process (X) and the previous process (Y) are provided so that a reference layer that becomes the reference for the overlay can be individually designated in the X-axis direction and the Y-axis direction. For example, since the previous process (X) and the previous process (Y) do not exist for the present process PROC1 of the first layer, the columns for these previous processes are left blank, and in the present process PROC2 of the second layer, since only PROC1 of the first layer exists as the previous process, PROC1 is designated as both the previous processes (X) and (Y). That is, in exposure of the second layer, the overlay exposure is performed so as to conform to the first layer both in the X-axis direction and the Y-axis direction. Further, in the present process PROC3 of the third layer, PROC1 is designated as the previous process (X) and PROC2 is designated as the previous process (Y). That is, in exposure of the third layer, the overlay exposure is performed so as to conform to the first layer in the X-axis direction while the overlay exposure is performed so as conform to the second layer in the Y-axis direction. Also for each of the remaining present processes, the previous process (X) to which the overlay exposure should be conformed in the X-axis direction and the previous process (Y) to which the overlay exposure should be conformed in the Y-axis direction are respectively designated.

Further, in the process program, whether the grid correction function is effective or ineffective is designated for each present process. In the example in FIG. 3C, the grid correction function is set to be effective in the present processes PROC3 and PROC4 and the grid correction function is set to be ineffective in other present processes. In this case, in the present processes in which the grid correction function is effective, the matching with the previous process (X) is performed in the X-axis direction and the matching with the previous process (Y) is performed in the Y-axis direction. Further, in the present processes in which the grid correction function is ineffective, the matching with the previous processes (X) and (Y) is not performed.

Host 160 controls the pointer that indicates which one of PROC1 to PROC5 the present process of the lot is. Accordingly, when starting the processing to the lot, host 160 can read out the process program file corresponding to the lot based on the pointer and refer to a process of a layer to be exposed next (present process).

Incidentally, in the process program file, information on a plurality of parameter groups in each of present processes PROC1 to PROC5 in FIG. 3C is also written. Such parameter groups include: a reticle-related parameter group such as a pattern size of a reticle, mark shape and placement, and drawing error; a wafer-related parameter group such as a shot size, a scanning direction and a stepping direction of each shot area, and a shot map including the center coordinate of the shot area; an exposure-condition-related parameter group such as an exposure dose, blind, a focal point, magnification, leveling, and an offset; an alignment-related parameter group such as an alignment sensor, an alignment method, and an offset; an illumination-condition-related parameter group such as a modified light source, and the shape of the secondary light source such as σ; and the like. The process program file is sent from host 160 to main controller 20 of each projection exposure apparatus $100_i$ when the present process is performed, and prior to exposure, main controller 20 sets the apparatus parameters based on the setting values of the parameter groups corresponding to the present process included in the process program.

Incidentally, the process program file is to be also sent to information central server 130 and stored in storage unit 140 in advance.

<Processing Start of Host>

The processing algorithm of host 160 shown in a flowchart of FIG. 4 starts when the preparatory operation for an exposure processing corresponding to a certain process program is started. Incidentally, it is assumed that wafer W of a lot subject to exposure is a wafer to which exposure of one or more layer(s) has been completed.

First of all, in Step 202 in FIG. 4, host 160 inquires of information central server 130 about a projection exposure apparatus appropriate for performing exposure of wafer W subject to exposure. Data that is sent on the inquiry includes information on an identifier (lot No.) and on a present process name obtained by referring to a process program of the lot subject to exposure. Then, the procedure proceeds to Step 204, and host 160 waits until a response to the inquiry from information central server 130 is sent to host 160.

<Processing Start of Information Central Server>

Meanwhile, when receiving the inquiry information described above, information central server 130 starts the processing (processing algorithm) of the program shown in a flowchart in FIG. 5.

First of all, in Step 302 in FIG. 5, information central server 130 searches the process program files stored in storage unit 140 using the lot No. included in the received inquiry information, and reads out the proper file and reads out reference layers corresponding to the present process designated in the process program file, that is, the previous process (X) and the previous process (Y), using the present process name. For example, in the process program file shown in FIG. 3C, in the case where the present process name is "PROC2", "PROC1" is read out as the previous process (X) and "PROC1" is read out as the previous process (Y), and in the case where the present process name is "PROC3", "PROC1" is read out as the previous process (X) and "PROC2" is read out as the previous process (Y).

In the next step, Step 304, information central server 130 reads out a lot history from the exposure history database stored in storage unit 140 using the lot No. of the process program as a key, and creates a lot history list for the lot as shown in FIG. 3B. In the next step, Step 306, by using the previous process name (X) as a key, information central server 130 reads out an apparatus name of projection exposure apparatus $100_i$, processing date and time, image distortion correction values, and the like, which were used for exposure in the previous process (X), from the lot history list, searches the database of distortion data of projected images stored in storage unit 140, and acquires distortion data of projected images related to the apparatus at the processing date and time in which the previous process (X) was performed. For example, in the case where the previous process (X) is "PROC1", an apparatus name $100_1$, processing date and time "Nov. 1, 2005", and image distortion correction values k1 to k20 at the date and time are read out from the lot history list shown in FIG. 3B, and image distortion data of apparatus $100_1$ in November 2005 is read out from the image distortion database shown in FIG. 3A.

In the next step, Step 308, information central server 130 further modifies (corrects) the acquired distortion data of projected images using the image distortion correction values on the previous process exposure that was read out in Step 304, and computes distortion data of projected images on exposure in the previous process.

In the next step, Step 310, whether or not the previous process (X) and the previous process (Y) are different processes is judged. When the judgment is affirmed, the procedure proceeds to Step 312, and when the judgment is denied, the procedure proceeds to Step 322.

In Step 312, information central server 130 reads out an apparatus name of projection exposure apparatus $100_i$, processing date and time, image distortion correction values, and the like, which were used for exposure in the previous process (Y), based on the lot history list created in Step 304 described above, searches the database of distortion data of projected images stored in storage unit 140, and acquires distortion data of projected images related to the apparatus at the processing date and time in which the previous process (Y) was performed. In the next step, Step 314, information central server 130 further modifies (corrects) the acquired distortion data of projected images using the image distortion correction values on the previous process exposure, and computes distortion data of projected images on the previous process exposure.

Figure 8A:
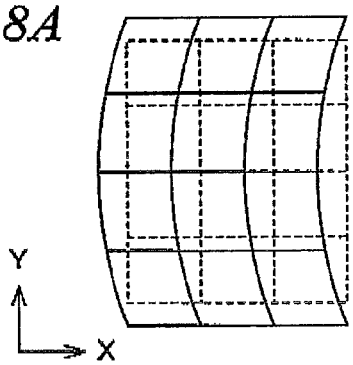
FIG. 8A is a view showing an example of image distortion data.
Figure 8B:
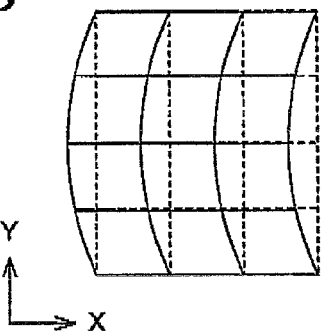
FIG. 8B is a view showing an example of image distortion data in the case of extracting only a distortion amount in the X-axis direction.

In the next step, Step 316, image distortion data is created by extracting only a distortion amount in the X-axis direction from the image distortion data of the previous process (X). FIG. 8A models an example of image distortion data of the previous process (X) before the extraction, and FIG. 8B models an example of extracted image distortion data in the X-axis direction of the previous process (X) after the extraction has been performed. In the example shown in FIG. 8A, the distortion of the projected image is distortion that is deformed into an arcuate shape in the X-axis direction and expands predetermined-fold in the Y-axis direction. In this case, as is shown in FIG. 8B, the extracted distortion of the projected image is only the arcuate deformation in the X-axis direction.

Figure 8C:
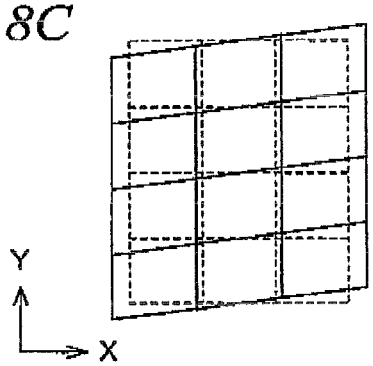
FIG. 8C is a view showing an example of image distortion data.
Figure 8D:
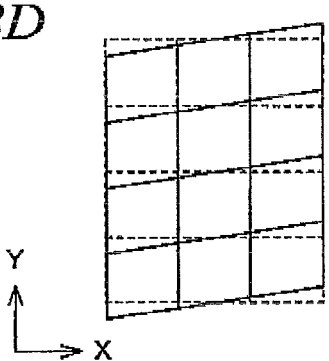
FIG. 8D is a view showing an example of image distortion data in the case of extracting only a distortion amount in the Y-axis direction.

In the next step, Step 318, image distortion data is created by extracting only a distortion amount in the Y-axis direction from the image distortion data of the previous process (Y). FIG. 8C models an example of image distortion data of the previous process (Y) before the extraction, and FIG. 8D models an example of extracted image distortion data of previous process (Y) after the extraction. In this case, in the example shown in FIG. 8C, the distortion of the projected image is (primary) distortion that expands in the X-axis direction predetermined-fold and inclines in the Y-axis direction. In this case, as is shown in FIG. 8D, the extracted distortion of the projected image is only the primary deformation in the Y-axis direction.

Figure 8E:
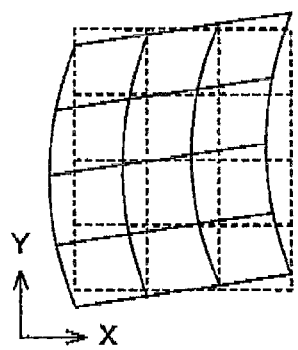
FIG. 8E is a view showing image distortion data after being synthesized.

In the next step, Step 320, the image distortion data extracted in Step 316 described above and the image distortion data extracted in Step 318 described above are synthesized. FIG. 8E shows image distortion data after the synthesis. In an example shown in FIG. 8E, the distortion of the projected image is distortion obtained by synthesizing the distortion in the X-axis direction shown in FIG. 8B and the distortion in the Y-axis direction shown in FIG. 8D.

In Step 322 that is executed after the judgment in Step 310 is denied or after Step 320 is executed, current image distortion data of each projection exposure apparatus $100_i$ (i=1 to N), in the case where each projection exposure apparatus $100_i$ is used in the present process, is acquired. In the next step, Step 324, data on difference between the image distortion data synthesized in Step 320 (or the image distortion data corrected in Step 308) and the latest image distortion data of an exposure apparatus in the present process is created.

Referring to FIG. 6, in the next step, Step 402, in the case where the distortion of projected images attempts to be adjusted in accordance with the data on difference in each projection exposure apparatus $100_i$, a drive amount (a washer drive amount) of the image-forming characteristic correction unit is computed using, for example, the least-squares method. Incidentally, the computation requires a table data file (a lens parameter file), which is composed of the displacement amount of image distortion (the variation amount of the position of each measurement mark image) with respect to a unit drive amount (an adjustment amount) of each of the drive elements (piezo elements 11a, 11b and 11c) that drive the movable lenses (such as lens element 27) in projection optical system PL of each projection exposure apparatus $100_i$.

In the next step, Step 404, by comparing the washer correction amount and the image plane inclination amount with the limit value (the value showing the correctable range) of projection exposure apparatus $100_i$, the projection exposure apparatus(-es) that has/have sufficient correction capability for correcting image distortion to perform the present process is/are extracted from among projection exposure apparatus $100_i$.

In the next step, Step 406, a displacement amount of image distortion data in the case of applying the washer correction amount to each of the extracted projection exposure apparatus $100_i$ is computed in the X-axis direction and the Y-axis direction respectively. In the next step, Step 408, the values of coefficients (so-called k parameters) $k_1$ to $k_{20}$ of the third-order model that show a displacement amount of image distortion data as is expressed in the following equation (1) are computed for each apparatus.

[Equation 1]

$$Dx = k_1 + k_3 \cdot x + k_5 \cdot y + k_7 \cdot x^2 + k_9 \cdot x \cdot y + k_{11} \cdot y^2 + k_{13} \cdot x^3 + \\ k_{15} \cdot x^2 \cdot y + k_{17} \cdot x \cdot y^2 + k_{19} \cdot y^3 \\ Dy = k_2 + k_4 \cdot y + k_6 \cdot x + k_8 \cdot y^2 + k_{10} \cdot y \cdot x + k_{12} \cdot x^2 + \\ k_{14} \cdot y^3 + k_{16} \cdot y^2 \cdot x + k_{18} \cdot y \cdot x^2 + k_{20} \cdot x^3 \qquad (1)$$

In the next step, step 410, the difference between the image distortion data in the previous process and image distortion data in the present process when assuming that projection exposure apparatus 100$_i$ (i=1 to N) is used as the present process processing apparatus (data on image distortion difference) is computed for each apparatus.

In the next step, Step 412, residual error data of final image distortion after correction in each coordinate within the shot is obtained for projection exposure apparatus 100$_i$, by subtracting the variation amount obtained in Step 406 from the data on image distortion difference obtained beforehand.

In step 414, projection exposure apparatus 100$_i$, in which the residual error data does not exceed the permissible value in all the coordinates, is extracted. In the next step, Step 416, an apparatus list of one or a plurality of projection exposure apparatus(-es), in which the residual error data of image distortion does not exceed the permissible value (including the image distortion correction value to be used in the listed apparatus(-es), and the residual error) is created, and in Step 418, information central server 130 transmits the appropriate apparatus list to host 160 as a response to the inquiry, and then finishes a series of processings.

On the other hand, while the processing of information central server 130 is being performed, host 160 waits for the response from information central server 130 in Step 204 in FIG. 4, and then by the processing in Step 418 described above being performed (the response to the inquiry being transmitted), the judgment in Step 204 is affirmed and the procedure proceeds to Step 206.

In Step 206, host 160 refers to the present operational situation and the future operational schedule, and the residual error of the apparatus(-es) (the appropriate apparatus(-es)) listed in the received apparatus list, and selects a projection exposure apparatus that should perform overlay exposure from among the appropriate apparatus(-es) listed in the received list, comprehensively considering the processing efficiency and the exposure accuracy in lithography system 110. For example, when a plurality of the appropriate apparatuses are not in operation at present, host 160 selects an exposure apparatus in which the residual error is the minimum as an exposure apparatus that should perform exposure in the present process, so that the exposure accuracy can be increased while securing the processing efficiency. As a matter of course, in the case where only one projection exposure apparatus is listed as an appropriate apparatus, the projection exposure apparatus is selected as an exposure apparatus that should perform exposure in the present process.

Further, for example, in the case where a plurality of projection exposure apparatuses are listed as appropriate apparatuses, if all the appropriate apparatuses are in operation, host 160 may also select a projection exposure apparatus in which the present exposure operation is scheduled to be completed first from among the appropriate apparatuses, from the viewpoint of placing a priority on the throughput, for example, or if only one projection exposure apparatus is not in operation at present, host 160 may also select the projection exposure apparatus from the similar viewpoint.

In the next step, Step 208, whether or not the grid correction is effective in the present process is judged referring to the process program. When the judgment is affirmed, the procedure proceeds to Step 210, and when the judgment is denied, the procedure proceeds to Step 214.

In the next step, Step 210, host 160 inquires of information central server 130 about the name of the correction map file. The inquiry includes lot No. of the lot, a present process name, an apparatus name of the apparatus of the present process that was selected in Step 206 described above. In the next step, Step 212, host 160 waits for a response.

Meanwhile, when receiving the inquiry information described above, information central server 130 starts the processing (processing algorithm) of the program shown in a flowchart in FIG. 7.

First of all, in Step 502, information central server 130 searches the process program files stored in storage unit 140 using the lot No. included in the received inquiry information, reads out the proper file, and reads out reference layers corresponding to the present process designated in the process program file, that is, the previous process (X) and the previous process (Y), and the combination of sample shots when performing the EGA (to be described later), using the present process name. For example, in the process program file shown in FIG. 3C, in the case where the present process name is "PROC4", "PROC2" is read out as the previous process (X) and "PROC3" is read out as the previous process (Y).

In the next step, Step 506, the correction map file of the process is read out using the previous process (X) as a key. Herein, in the case where the correction map file of the previous process (X) itself has been registered in the database, information central server 130 reads out that correction map file. On the other hand, in the case where the correction map file has not been registered in the database yet, information central server 130 acquires the apparatus name of the previous process (X) by referring to the exposure history database using the previous process (X) as a key, searches the database of the correction map files stored in storage unit 140 using the apparatus name of the previous process (X) and the combination of sample shots read out from the process program file as keys, and reads out the correction map file of the apparatus that performed the previous process (X), as a correction map file (X).

In the next step, Step 508, whether or not the previous process (X) and the previous process (Y) are different is judged. When the judgment is affirmed, the procedure proceeds to Step 510, and when the judgment is denied, the procedure proceeds to Step 520.

In Step 510 that is performed after the judgment is affirmed, the correction map file of the previous process (Y) is read out. Also in this case, in the case where the correction map file of the previous process (Y) itself has been registered, information central server 130 reads out that correction map file. On the other hand, in the case where the correction map file has not been registered in the database yet, information central server 130 acquires the apparatus name of the previous process (Y) by referring to the exposure history database using the previous process (Y) as a key, searches the database of the correction map files stored in storage unit 140 using the apparatus name of the previous process (Y) and the combination of sample shots read out from the process program file as keys, and reads out the correction map file of the apparatus that performed the previous process (Y), as a correction map file (Y).

Figure 10A:
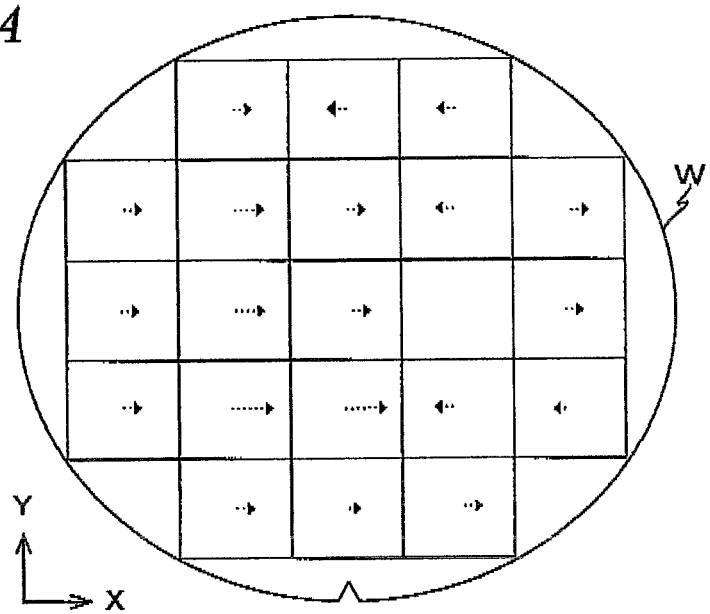
FIG. 10A is a view showing an example of a correction map obtained when extracting only a nonlinear component in the X-axis direction.
Figure 10B:
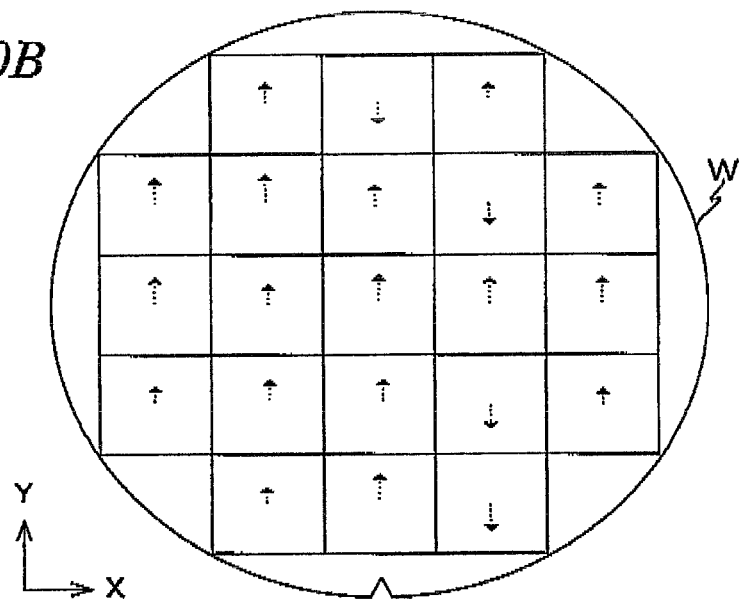
FIG. 10B is a view showing an example of a correction map obtained when extracting only a nonlinear component in the Y-axis direction.
Figure 11:
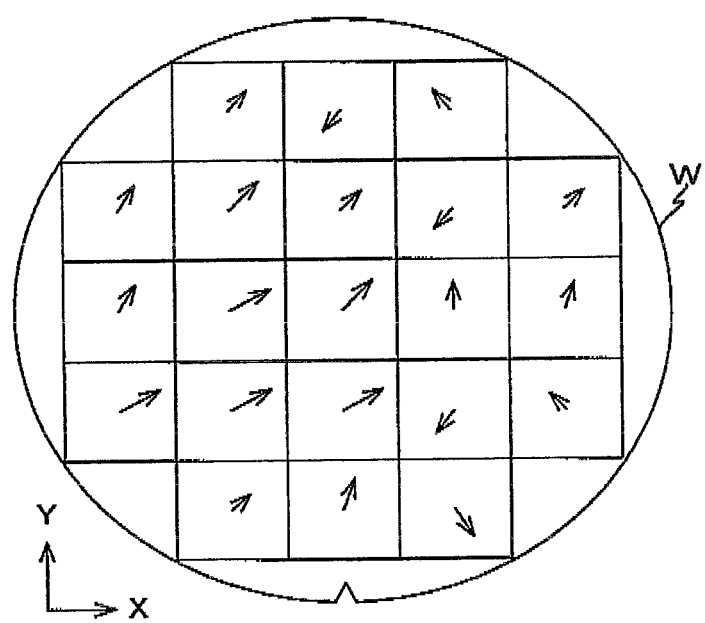
FIG. 11 is a view showing an example of a synthesized correction map.

In the next step, Step 512, information central server 130 extracts only a correction amount in the X-axis direction from the correction amount data within the correction map file (X), and in the next step, Step 514, extracts only a correction amount in the Y-axis direction from the correction amount data within the correction map file (Y). Then, in the next step, Step 516, information central server 130 synthesizes the extracted correction amount only in the X-axis direction and the extracted correction amount only in the Y-axis direction, and in Step 518, creates a new correction map based on the synthesis result. FIG. 10A models an example of the correction amount in the X-axis direction extracted in Step 512, and FIG. 10B models an example of the correction amount in the Y-axis direction extracted in Step 514. FIG. 11 models an example of the correction map created by synthesizing these correction amounts.

In Step 520 that is executed after the judgment in Step 508 is denied or after Step 518 is executed, information central server 130 reads out the correction map file of the apparatus of the present process using the apparatus name of the present process as a key, and in Step 522, information central server 130 creates data on difference between the correction map of the apparatus of the present process and the synthesized correction map created in Step 518 (or the correction map read out in Step 506). In the next step, Step 524, assuming the group of the data on difference as the correction map file of the present process, information central server 130 registers its file name in the database and also stores it in storage unit 140. Then, in Step 526, information central server 130 transmits the name of this new correction map file to host 160 as a response to the inquiry, and ends the processing. The new correction map file is a correction map file that is to be read out when the present layer is designated as the previous process (X) or the previous process (Y).

Meanwhile, while the processing of information central server 130 is being performed, host 160 waits for a response from information central server 130 in Step 212 in FIG. 4, and then by the processing in Step 520 described above being performed (the response to the inquiry being transmitted), the judgment in Step 212 is affirmed and the procedure proceeds to Step 214.

Then, in Step 214, whether or not the operation of the selected projection exposure apparatus $100_i$ has been finished is judged, and in the case where the judgment is denied, host 160 waits until the operation is finished. On the other hand, in the case where the judgment in Step 214 is affirmed, that is, in the case where the selected projection exposure apparatus $100_i$ finished the operation from the beginning (are not in operation) or has finished the operation, the procedure proceeds to Step 216, in which host 160 issues instructions of exposure execution to main controller 20 of the selected projection exposure apparatus $100_i$. The exposure instructions include the process program file. The process program file includes the correction map file name read out from information central server 130 and the image distortion correction value that should be adjusted in projection optical system PL of the selected projection exposure apparatus $100_i$. After that, the procedure proceeds to Step 218, and host 160 waits for a notice of exposure end.

Figure 9:
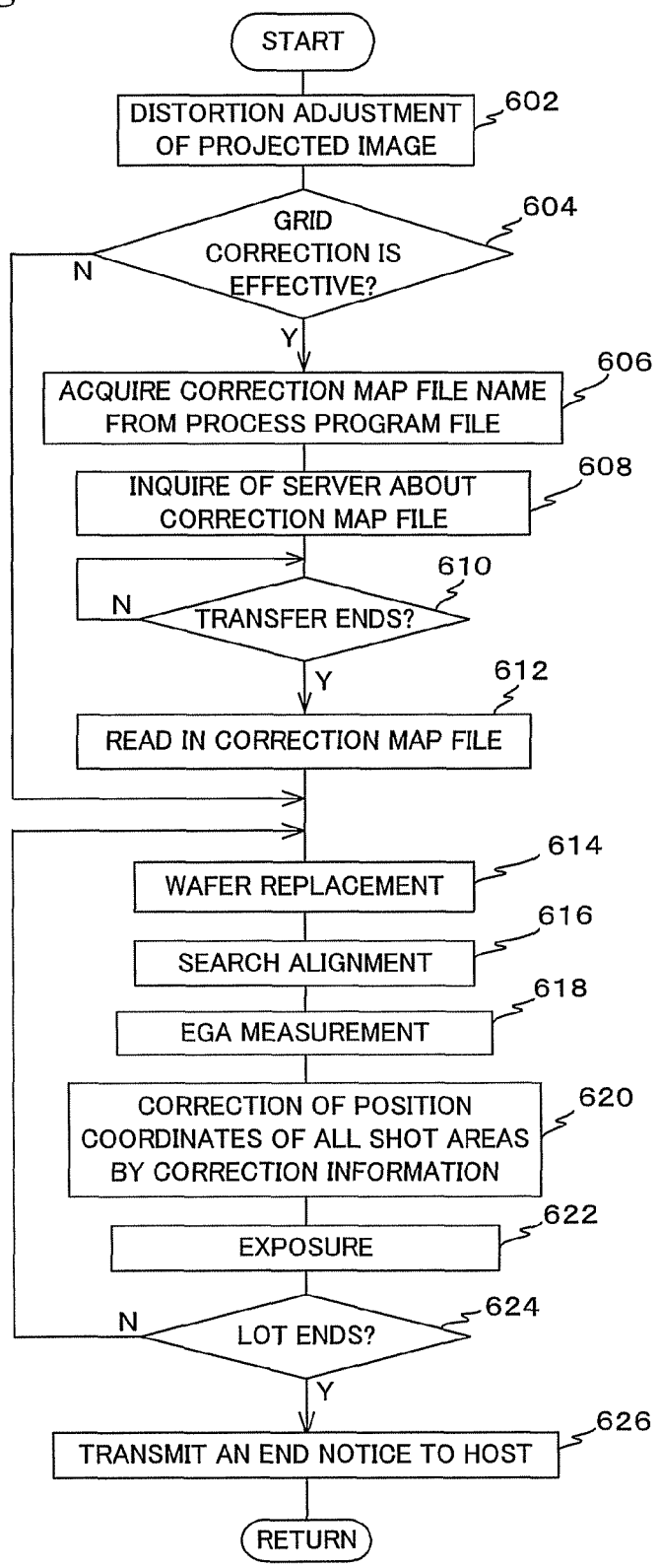
FIG. 9 is a flowchart that shows a processing algorithm of the projection exposure apparatus.

When the instructions of exposure execution are issued, main controller 20 of the selected projection exposure apparatus $100_i$ ("i" is either of 1 to N) starts the processing shown in a flowchart in FIG. 9. It is assumed that all of the loading of reticle R, reticle alignment with reference to fiducial mark plate FM, baseline measurement and the like have been completed.

As is shown in FIG. 9, first of all, in Step 602, main controller 20 adjusts distortion of projected images by controlling the image-forming characteristic correction unit within the apparatus itself based on the received image distortion correction value. Specifically, main controller 20 computes the applied voltage to each drive element corresponding to the image distortion correction value that has been received from host 160, and drives each of the drivable lens elements by applying the applied voltage to each drive element via image-forming characteristic control section 12, thereby adjusting distortion and the like of the projection optical system.

In the next step, Step 604, main controller 20 judges whether or not the grid correction function is effective referring to the process program. The following steps 606→608→610→612 are executed in the case where the judgment is affirmed.

First, in Step 606, main controller 20 acquires the file name of the correction information file stored in the process program file, and in Step 608, requests for the forwarding of the correction map file corresponding to the file name from storage unit 140 via information central server 130, then in Step 610, waits until the forwarding is finished.

When the forwarding is finished, in Step 612, main controller 20 reads in the contents of the correction map file. Incidentally, during the period of waiting for the forwarding, main controller 20 can read in various parameters such as the exposure condition from the process program and set them as the apparatus parameters.

After Step 612 is finished or after the judgment in Step 604 is denied, in Step 614, wafer replacement is performed. In this case, a head wafer W of the lot is loaded on wafer stage WST using a wafer carriage system (not shown). In the next step, Step 616, search alignment is performed. In this case, by measuring the position coordinates of search alignment marks formed according to the array of the shot areas on wafer W, rough array coordinates of the shot areas are obtained.

In the next step, Step 618, the EGA measurement is performed. In this case, wafer alignment by the EGA method is performed according to shot data such as the shot map data and selection information of sample shot areas which is included in the process program, and the position coordinates of all the shot areas on wafer W are computed and stored in a predetermined area of the internal memory. Since the EGA measurement is disclosed in, for example, Kokai (Japanese Unexamined Patent Application Publication) No. 61-044429 (the corresponding U.S. Pat. No. 4,780,617) and the like, the detailed description will be omitted here. As long as the national laws in designated states (or elected states), to which this international application is applied, permit, the above disclosures of the publication and the U.S. patent are incorporated herein by reference.

In the next step, Step 620, based on the array coordinates of all the shot areas and the correction value (correction information) of a nonlinear component of the positional deviation amount of each shot area in the correction map file, the overlay correction position in which the positional deviation amount (the linear component and the nonlinear component) of each shot area has been corrected is computed. However, Step 620 is not performed in the case where the grid correction function is ineffective.

In the next step, Step 622, based on the computed overlay position and the baseline measured in advance, main controller 20 performs an exposure operation by a step-and-scan method by repeating an operation of sequentially performing stepping of wafer W to an acceleration starting position (a scanning starting position) to expose each shot area on wafer W and an operation of transferring a reticle pattern onto the wafer while synchronously moving reticle stage RST and wafer stage WST in a scanning direction. With this operation, the exposure processing to head wafer W of the lot (the first wafer W in the lot) is finished. Incidentally, the multipoint focal position detection system (13, 14) performs autofocus-leveling control of wafer W with respect to projection optical system PL.

In the next step, Step 624, the judgment is made of whether exposure to all wafers W in the lot has been finished. In this case, sine only exposure to the first wafer has been finished, the judgment is denied, and the procedure returns to Step 614. Afterward, until exposure of all wafers W in the lot is finished and the judgment in Step 624 is affirmed, Steps 614→616→618→620>622→624 are repeated, and exposure to wafers W in the lot is performed. After the judgment in Step 624 is affirmed, the procedure proceeds to Step 626.

In Step 626, main controller 20 notifies host 160 of exposure end. At this point in time, together with the notice of exposure end, exposure history data thereof is sent from main controller 20 of projection exposure apparatus $100_i$ to host 160.

Meanwhile, host 160 is in a state of waiting in Step 218 in FIG. 4 during the period exposure of the present process described above is being performed. When the judgment in Step 218 is affirmed by the notice of exposure end described above, the procedure proceeds to Step 220, in which host 160 notifies information central server 130 of the exposure history data that has been received together with the notice of exposure end from main controller 20 of the selected projection exposure apparatus $100_i$ in Step 626 (FIG. 9) described above, and then finishes a series of processings. Information central server 130 stores the exposure history data in storage unit 140 and registers it in the database.

As is described in detail above, according to the embodiment, since the reference layer (the layer of the previous process) for overlay exposure of the next layer (the present process) is selected for each axis of the XY coordinate system, it becomes possible to adjust distortion of projected images per axis with reference to the distortion component of projected images of projection exposure apparatus $100_i$ at the point in time when exposure of the reference layers (the previous process (X) and the previous process (Y)) was performed included in information on overlay exposure. With this operation, overlay exposure with higher accuracy in accordance with the circuit pattern design can be realized.

Further, according to the embodiment above, since the reference layer for overlay exposure of the next layer is selected for each axis of the XY coordinate system, it becomes possible to adjust the nonlinear component for each axis with reference to the nonlinear component of the positional deviation amount of formation position of each of a plurality of shot areas in the projection exposure apparatus that was used in exposure of the reference layers (the previous process (X) and the previous process (Y)) included in information on overlay exposure.

Incidentally, in the embodiment above, the explanation has been conducted assuming that one each layer is selected for each axis of the XY coordinate system as a reference layer (a layer in the previous process) for overlay exposure of the next layer (the present process), but the present invention is not limited thereto, and a plurality of layers may also be selected depending on the axis as reference layers. For example, in the case where the overlay of the next layer D is performed to a substrate to which three layers A, B and C have been overlaid sequentially from the lower layer of the substrate, the layer A and the layer B may be selected as reference layers for the X-axis and the layer C may be selected as a reference layer for the Y-axis.

Further, there may also be a reference layer that is selected as a reference layer for both axes (XY axes). For example, the layer A and the layer B may be selected as reference layers for the X-axis and the layer A and the layer C may be selected as reference layers for the Y-axis. In this case, the layer A is selected as a reference layer for both X and Y axes.

Moreover, in the case where a plurality of layers are selected as reference layers for each axis as is described above, the distortion components of projected images of the selected layers or the nonlinear components of the positional deviation amount of shot array of the selected layers may also be used after performing statistical processing. As the statistical processing in this case may be the simple averaging processing or the weighted average processing in which weight is added to each of the selected reference layers. Incidentally, when performing the weighted average, various weighed methods can be considered, for example, a method of increasing the weight of the reference layers according to the proximity of the reference layers to the present process (the positional relation between layers), a method of increasing the weight of the reference layers according approximation of the linewidth to the linewidth of the present process (the order of approximation of linewidth), or a method of increasing the weight of the reference layers according to similarity of the process (steps) which the reference layers went through to the process (steps) of the present process (the degree of similarity of the process (steps)).

In this manner, since overlay exposure of the next layer is performed while adjusting the exposure state of the projection exposure apparatus per axis based on the formation state (such as distortion of the projected image, or the nonlinear component of the array of shot areas) of the pattern image of the selected reference layer (the previous process (X) and the previous process (Y)), the overlay exposure with higher accuracy in accordance with circuit design information of the device can be realized.

In the description of exposure process (steps) in the embodiment above, there is only one exposure ID for each projection exposure apparatus $100_i$, but as is described above, a plurality of different exposure conditions can be set for each projection exposure apparatus $100_i$ in actual, and the exposure ID in the previous process (X) is different from exposure ID in the previous process (Y) in some cases. In such cases, the exposure history includes information on exposure ID when performing exposure of the previous process and the like, and image distortion data is also obtained periodically per exposure condition, and therefore, image distortion data of each axis can be extracted from the image distortion data under that exposure condition. Similarly, since the exposure history also includes information on the reticle used in the process and the like, it is also possible to synthesize the reticle manufacturing errors of the respective axes and use it for correction in exposure of the present process. In this manner, by making the previous process, which should be the reference, be separately selectable per axis and also retaining information of the previous process, and not smoothing information of each axis by average but performing vector synthesis per axis, it becomes possible to realize highly accurate overlay exposure in accordance with the circuit design.

Incidentally, although the previous process can be selected separately for the X-axis direction and the Y-axis direction in the embodiment above, the previous process may also be selected separately for two axes that are orthogonal to each other in the XY plane. For example, the setting can be performed so that the previous process is selected separately for two axes angled at 45 degrees to the X-axis and the Y-axis respectively.

Further, two axes for which the previous process can be separately selected do not always have to be orthogonal. Even if the two axes are not orthogonal, overlay exposure with higher accuracy can be realized in the case where the vector synthesis of information of the respective axes can be performed, than the case when information of the previous process is simply averaged. Furthermore, the number of axes for the synthesis is not limited to two, but may be three or more. In such a case, the vector synthesis of information on all the axes only has to be performed.

Further, in the embodiment above, although measurement of image distortion data of each projection exposure apparatus $100_i$ is to be performed monthly, the interval can be arbitrarily set and the measurement may be performed annually or daily, or at irregular intervals. The interval only has to be set in accordance with the change over time of image distortion data of each projection exposure apparatus $100_i$, and the interval may also be different per apparatus.

Further, in the embodiment above, the grid correction function using the correction map is applied, but as such grid correction function, a grid correction function, in which the correction map is not used but the positional deviation amount of the shot center is expressed in the mathematical function (correction mathematical function) assuming X and Y as independent variables and the correction mathematical function is used, can also be applied.

In the case of a lithography system that manufactures a wide variety of products in small quantities, in actual, wafers that become different products are included in the same lot in some cases. The present invention can also be applied to such cases as a matter of course.

Incidentally, in the embodiment above, all of projection exposure apparatuses $100_1$ to $100_N$ are to have the correction function for distortion of projected images. However, the present invention is not limited thereto, but some of projection exposure apparatuses $100_1$ to $100_N$ may be capable of adjusting distortion of projected images. In this case, information central server 130 computes the image distortion correction value to be used on exposure in the present process only for such projection exposure apparatuses that are capable of adjusting distortion of projected images. Then, in the case where host 160 selects one of the projection exposure apparatuses that are capable of adjusting distortion of projected images as an appropriate apparatus (projection exposure apparatus) for performing exposure in the present process, the image distortion correction value is sent as part of the exposure command to the selected appropriate apparatus. This can also be said for the grid correction function, and all the projection exposure apparatuses do not have to be equipped with the grid correction function.

Incidentally, in the case of the scanning exposure apparatus, in some cases, the image distortion data at each measurement point described above includes a linear distortion component of position control of the stage system, that is, a so-called stage component, which is caused by the deviation in the velocity ratio of reticle state RST and wafer stage WST, or the deviation between the scanning direction of reticle stage RST and the scanning direction of wafer stage WST, or the like. Accordingly, in the case where overlay exposure is performed after excluding such a stage component, it is preferable to perform comparison of image distortion data between the measurement points after the stage component is excluded from the measured image distortion data.

Further, in the case where the reflection surfaces for interferometers (the reflection surfaces of the movable mirrors in the embodiment above) arranged on the reticle stage or the wafer stage have bending including unevenness, inclination, curvature and the like, this component is included in the image distortion data, and therefore, the bending component is preferably excluded beforehand similarly.

Further, an extension lens parameter file, which is extended by including the stage component in the adjustment amount of the lens parameter file described above, is created in advance, and the similar processing to the embodiment above may also be performed using the extension lens parameter file. In this case, in the case where a control amount of the stage component that is not zero is computed based on the computed image distortion correction value, main controller 20 should adjust at least one of the velocity ratio and the deviation between the scanning directions of reticle stage RST and wafer stage WST according to the control amount.

Further, in the embodiment above, measurement of distortion of a pattern image in each projection exposure apparatus is performed by actually transferring a pattern formed on a test reticle onto a wafer and measuring the pattern transferred on the wafer, but instead of this method, distortion of a pattern image in each projection exposure apparatus may also be obtained based on measurement results of an aerial image (a projected image) of a pattern formed on a test reticle using an aerial image measuring instrument. Further, in the embodiment above, distortion in the previous process is to be computed based on the transferred image formed on the wafer, but the present invention is not limited thereto, and a plurality of marks with which distortion can be known are placed in advance on a layer, and the distortion of the previous process may also be obtained by measuring the marks.

Further, in the embodiment above, in order to acquire image distortion data of the scanning exposure apparatus, image distortion data (dynamic distortion data) in the entire area of the scanning exposure range is to be obtained by transferring a pattern of a test reticle onto a wafer in a scanning exposure method, but by transferring a pattern of a test reticle onto a wafer by a static exposure method, only image distortion data (static distortion data) within an exposure area (i.e. an irradiation area of an illumination light on a wafer) having a rectangular shape of the projection optical system may also be obtained based on detection results of the transferred image.

Incidentally, in the embodiment above, information central server 130 performs synthesis of image distortion data in the X-axis direction and image distortion data in the Y-axis direction, and synthesis of stage grid in the X-axis direction and stage grid in the Y-axis direction, but these syntheses may also be performed by host 160 or main controller 20.

In this manner, the present invention is not limited to the configuration of lithography system 110. For example, storage unit 140 may be directly connected to main controller 20 or may be connected to main controller 20 via LAN170.

For example, in the embodiment above, the case has been described where each projection exposure apparatus $100_i$ (i=1, 2, . . . , N), information central server 130 and storage unit 140, and terminal server 150 and host computer system 160 are connected to one another via local area network (LAN) 170, but the present invention is not limited thereto, and the configuration in which each projection exposure apparatus $100_i$ (i=1, 2, . . . , N), information central server 130 and host computer system 160 perform communication with one another via wireless line may also be employed.

Incidentally, as storage unit 140, it goes without saying that storage units that store data in various storing forms can be employed such as a storage unit that magnetically stores data (a magnetic disk, a magnetic tape, or the like), a storage unit that electrically stores data (a semiconductor memory such as a RAM with battery backup, or the like), a storage unit that stores magnetooptically stores data (a magnetooptical disk, or the like), a storage unit that electromagnetically stores data (a digital audio tape (DAT), or the like).

Incidentally, in the embodiment above, a plurality of projection exposure apparatuses $100_1$ to $100_N$ that constitute the lithography system are all the scanning exposure apparatuses, but both the scanning exposure apparatuses and the static exposure apparatuses may be constitute the lithography system, or all the projection exposure apparatuses may be the static exposure apparatuses. Further, among a plurality of projection exposure apparatuses $100_1$ to $100_N$ that constitute lithography system 110, there may be exposure apparatuses that have different resolutions or exposure apparatuses in which the wavelengths of exposure lights IL are different.

Further, the exposure subject of the projection exposure apparatuses is not limited to a wafer for manufacturing semiconductor devices as in the embodiment above, but the present invention may also be widely applied to exposure subjects such as a glass plate having a square shape used for manufacturing display devices such as liquid crystal display devices, plasma displays or organic EL, or a substrate used for manufacturing thin film magnetic heads, imaging devices (such as CCD), masks or reticles.

Further, the magnification of the projection optical system in the projection exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image.

Incidentally, at least one of the projection exposure apparatuses in the lithography system may also be an apparatus that uses an electron mask that forms a transmissive pattern or a reflection pattern, or an emission pattern according to electronic data of the pattern that is to be exposed. Such an electron mask is disclosed in, for example, U.S. Pat. No. 6,778,257. As long as the national laws in designated states (or elected states), to which this international application is applied, permit, the above disclosure of the U.S. patent is incorporated herein by reference.

Incidentally, the above-described electron mask is the concept that includes both a non-emissive image display device and a self-emissive image display device. Herein, the non-emissive image display device is also called a spatial light modulator, and is a device that spatially modulates the amplitude, the phase or the state of polarization of light, and is divided into a transmissive spatial light modulator and a reflective spatial light modulator. The transmissive spatial light modulator includes a transmissive liquid crystal display device (LCD), an electrochromic display (ECD), and the like. And, the reflective spatial light modulator includes a DMD (Digital Mirror Device or Digital Micro-mirror Device), a reflection mirror array, a reflective liquid crystal displace device, an electrophoretic display (EPD), an electronic paper (or electronic ink), a grating light valve, and the like.

Further, the self-emissive image display device includes a CRT (Cathode Ray Tube), an inorganic EL (Electro Luminescence) display, a field emission display (FED), a plasma display (PDP: Plasma Display Panel), a solid state light source chip having a plurality emission points, a solid state light source chip array in which a plurality of chip are arranged in the array, or a solid state light source array (such as an LED (Light Emitting Diode) display, an OLED (Organic Light Emitting Diode) display, an LD (Laser Diode) display) where a plurality of emission points are fabricated on one substrate, and the like. Incidentally, by removing the fluorescent material provided in each pixel of the known plasma display (PDP), the self-emissive image display device that emits a light in the ultraviolet region is made.

Further, in the projection optical system, in the case where a far ultraviolet light such as a KrF or ArF excimer laser light is used, the materials that transmit the far-ultraviolet light such as quartz or fluorite need to be used as glass materials, and in the case where an $F_2$ laser light or the like is used, fluorite or other fluoride crystals need to be used.

Further, in the embodiment above, an illumination light for exposure of the projection exposure apparatuses controlled by host 160 is not limited to a light having a wavelength equal to or more than 100 nm, but it is needless to say that the light having a wavelength less than 100 nm may be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, such an apparatus can also be employed as the projection exposure apparatus that constitutes the lithography system of the present invention. Moreover, exposure apparatuses such as a liquid immersion exposure apparatus that has liquid (such as pure water) filled in between projection optical system PL and a wafer, which is disclosed in, for example, the Pamphlet of International Publication No. WO99/49504 and the like, or an exposure apparatus by a step-and-stitch method can also be employed as the projection exposure apparatus that constitutes the lithography system of the present invention. In addition, the present invention can also be applied to a twin-stage-type exposure apparatus that is equipped with two wafer stages, or a multi-exposure apparatus that performs exposure using a plurality of exposure lights.

Further, an exposure apparatuses that uses charged particle beams such as an electron beam or an ion beam can also be employed as the projection exposure apparatus that constitutes the lithography system of the present invention. Incidentally, the electron beam exposure apparatus may be based on either of a pencil beam method, a variable shaped beam method, a cell projection method, a blanking aperture array method, or a mask projection method.

A semiconductor device is manufactured through the following steps: a step of performing function and performance design of device, a step of manufacturing a reticle based on the design step, a step of manufacturing wafer W using silicon materials, a lithography step of transferring a pattern of the reticle to wafer W by lithography system 110 and exposure apparatus $100_i$ in the embodiment above, a memory repair step, a step of assembling the device (including the dicing process, the bonding process, and the packaging process), an inspection step, and the like. In this case, in the lithography step, since the exposure method is executed using exposure apparatus $100_i$ in the embodiment above, and a device pattern is formed on a substrate, the device with higher integration can be manufactured with good yield.

INDUSTRIAL APPLICABILITY

As is described above, the lithography system and the exposure method of the present invention are suitable for transferring by overlaying patterns onto a photosensitive object using a plurality of projection exposure apparatuses.

What is claimed is:

1. An exposure method in which overlay exposure to a photosensitive object is performed by overlaying layers on the object, the method comprising:

a selection process in which a reference layer on the object that serves as a reference to obtain information on overlay exposure of a next layer on the object is selected for a first axis and a second axis, respectively, of a two-dimensional orthogonal coordinate system that serves as a reference on overlay, from among at least two layers on the object that have been already exposed, wherein, the information on overlay exposure includes a distortion component of a projected image at the point in time when exposure of the selected reference layer was performed, in a projection exposure apparatus that was used for the exposure of the selected reference layer, the selection process includes selecting a plurality of reference layers on the object for at least one of the first axis and the second axis so that a reference layer selected for the first axis and a reference layer selected for the second axis are different, and the distortion component of the projected image of the axis for which the plurality of reference layers have been selected is computed by computation processing using distortion components of projected images of the selected plurality of reference layers, wherein the computation processing is weighted average processing.

2. The exposure method according to claim 1, further comprising:

a process in which while adjusting an exposure state of a projection exposure apparatus for each of the axes based on information on a formation state of a pattern image on a selected reference layer, overlay exposure of a next layer is performed.

3. The exposure method according to claim 1, wherein a criterion for deciding weights of the weighted average processing includes a positional relation of the selected plurality of reference layers with a layer subject to exposure, the degree of approximation of pattern linewidth between the selected plurality of reference layers and the layer subject to exposure, and the degree of similarity of process between the selected plurality of reference layers and the layer subject to exposure.

4. An exposure method in which overlay exposure to a photosensitive object is performed by overlaying layers on the object, the method comprising:

a selection process in which a reference layer on the object that serves as a reference to obtain information on overlay exposure of a next layer on the object is selected for a first axis and a second axis, respectively, of a two-dimensional orthogonal coordinate system that serves as a reference on overlay, from among at least two layers on the object that have been already exposed, wherein the information on overlay exposure includes a nonlinear component of a positional deviation amount of formation positions of a plurality of divided areas with respect to positions, which serve as datum positions when the plurality of divided areas are formed on the object, in a projection exposure apparatus that was used for the exposure of the selected reference layer, the selection process includes selecting a plurality of reference layers on the object for at least one of the first axis and the second axis so that a reference layer selected for the first axis and a reference layer selected for the second axis are different, and the nonlinear component of the positional deviation amount of the plurality of divided areas that corresponds to the axis for which the plurality of reference layers have been selected is computed by computation processing using nonlinear components of positional deviation amounts of the formation positions of the plurality of divided areas with respect to the datum positions in the selected plurality of reference layers, wherein the computation processing is weighted average processing.

5. The exposure method according to claim 4, further comprising:

a process in which while adjusting an exposure state of a projection exposure apparatus for each of the axes based on information on a formation state of a pattern image on a selected reference layer, overlay exposure of the next layer is performed.

6. The exposure method according to claim 4, wherein a criterion for deciding weights of the weighted average processing includes a positional relation of the selected plurality of reference layers with a layer subject to exposure, the degree of approximation of pattern linewidth between the selected plurality of reference layers and the layer subject to exposure, and the degree of similarity of process between the selected plurality of reference layers and the layer subject to exposure.

7. A lithography system that performs overlay exposure to a photosensitive object by overlaying layers on the object, the system comprising:

a plurality of projection exposure apparatuses;

a storage unit that stores information on a formation state of a pattern image of a layer on the object that has been already exposed by any one of the plurality of projection exposure apparatuses;

a first selection unit that selects a reference layer on the object that serves as a reference to obtain information on overlay exposure of a next layer on the object for a first axis and a second axis, respectively, of a two-dimensional orthogonal coordinate system that serves as a reference on overlay, from among at least two layers on the object that have been already exposed, wherein the information on overlay exposure includes a distortion component of a projected image at the point in time when exposure of the selected reference layer was performed, in a projection exposure apparatus that was used for the exposure of the selected reference layer, the first selection unit selects a plurality of reference layers on the object for at least one of the first and second axis so that a reference layer selected for the first axis and a reference layer selected for the second axis are different;

a second selection unit that selects a projection exposure apparatus that performs overlay exposure of a next layer on the object from among the plurality of projection exposure apparatuses; and a computation unit that computes information on overlay exposure of the next layer in the selected projection exposure apparatus based on information on an exposure state of the selected reference layer for each of the axes, and computes the distortion component of the projected image of the axis for which the plurality of reference layers have been selected, by computation processing using distortion components of projected images of the selected plurality of reference layers,
wherein the computation processing is weighted average processing.

8. The lithography system according to claim 7, further comprising:
an adjusting unit that adjusts an exposure state of a projection exposure apparatus for each of the axes based on information on a formation state of a pattern image on a selected reference layer, when overlay exposure of the next layer is performed.

9. The lithography system according to claim 7, wherein a criterion for deciding weights of the weighted average processing includes a positional relation of the selected plurality of reference layers with a layer subject to exposure, the degree of approximation of pattern linewidth between the selected plurality of reference layers and the layer subject to exposure, and the degree of similarity of process between the selected plurality of reference layers and the layer subject to exposure.

10. A lithography system that performs overlay exposure to a photosensitive object by overlaying layers on the object, the system comprising:
a plurality of projection exposure apparatuses;
a storage unit that stores information on a formation state of a pattern image of a layer on the object that has been already exposed by any one of the plurality of projection exposure apparatuses;
a first selection unit that selects a reference layer on the object that serves as a reference to obtain information on overlay exposure of a next layer on the object for a first axis and a second axis, respectively, of a two-dimensional orthogonal coordinate system that serves as a reference on overlay, from among at least two layers on the object that have been already exposed, wherein,
the information on overlay exposure includes a nonlinear component of a positional deviation amount of formation positions of a plurality of divided areas with respect to positions, which serve as datum positions when the plurality of divided areas are formed on the object, in a projection exposure apparatus that was used for overlay exposure of the selected reference layer,
the first selection unit selects a plurality of reference layers on the object for at least one of the first axis and the second axis so that a reference layer selected for the first axis and a reference layer selected for the second axis are different;
a second selection unit that selects a projection exposure apparatus that performs overlay exposure of the next layer from among the plurality of projection exposure apparatuses; and
a computation unit that computes information on overlay exposure of the next layer in the selected projection exposure apparatus based on information on an exposure state of the selected reference layer for each of the axes, and computes the nonlinear component of the positional deviation amount of the plurality of divided areas that corresponds to the axis for which the plurality of reference layers have been selected, by computation processing using nonlinear components of positional deviation amounts of the formation positions of the plurality of divided areas with respect to the datum positions in the selected plurality of reference layers,
wherein the computation processing is weighted average processing.

11. The lithography system according to claim 10, further comprising:
an adjusting unit that adjusts an exposure state of a projection exposure apparatus for each of the axes based on information on a formation state of a pattern image on a selected reference layer, when overlay exposure of the next layer is performed.

12. The lithography system according to claim 10, wherein a criterion for deciding weights of the weighted average processing includes a positional relation of the selected plurality of reference layers with a layer subject to exposure, the degree of approximation of pattern linewidth between the selected plurality of reference layers and the layer subject to exposure, and the degree of similarity of process between the selected plurality of reference layers and the layer subject to exposure.

13. An exposure method in which overlay exposure to a photosensitive object is performed by overlaying layers on the object, the method comprising:
selecting a plurality of reference layers on the object that serve as a reference to obtain information on overlay exposure of a next layer on the object for a first axis of a two-dimensional orthogonal coordinate system that serves as a reference on overlay, from among at least two layers on the object that have been already exposed, where the information on overlay exposure includes a distortion component of a projected image at a point in time when exposure of the selected plurality of reference layers was performed, in a projection exposure apparatus that was used for the exposure of the selected plurality of reference layers, and the distortion component of the projected image of the first axis for which the plurality of reference layers have been selected is computed by weighted average processing using distortion components of projected images of the selected plurality of reference layers; and
selecting at least one reference layer on the object to obtain information on overlay exposure of the next layer on the object for a second axis of the two-dimensional orthogonal coordinate system, from among the at least two layers on the object that have already been exposed, so that at least one reference layer on the object selected for one of the first axis and the second axis is not selected for the other of the first axis and the second axis, where the information on overlay exposure of the next layer on the object for the second axis includes a distortion component of a projected image at a point in time when exposure of the selected at least one reference layer on the object to obtain information on overlay exposure of the next layer on the object for the second axis was performed, in a projection exposure apparatus that was used for the exposure of the selected at least one reference layer on the object to obtain information on overlay exposure of the next layer on the object for the second axis.

14. The exposure method according to claim 13, wherein the selected plurality of reference layers and the selected at least one reference layer together are layers that are overlaid sequentially on the object.

15. An apparatus in which overlay exposure to a photosensitive object is performed by overlaying layers on the object, the apparatus comprising:
a selection unit which
selects a plurality of reference layers on the object that serve as a reference to obtain information on overlay exposure of a next layer on the object for a first axis of a two-dimensional orthogonal coordinate system that serves as a reference on overlay, from among at least two layers on the object that have been already exposed, where the information on overlay exposure includes a distortion component of a projected image at a point in time when exposure of the selected plurality of reference layers was performed, in a projection exposure apparatus that was used for the exposure of the selected plurality of reference layers, and the distortion component of the projected image of the first axis for which the plurality of reference layers have been selected is computed using distortion components of projected images of the selected plurality of reference layers, and selects at least one reference layer on the object to obtain information on overlay exposure of the next layer on the object for a second axis of the two-dimensional orthogonal coordinate system, from among the at least two layers on the object that have already been exposed, so that at least one reference layer on the object selected for one of the first axis and the second axis is not selected for the other of the first axis and the second axis, where the information on overlay exposure of the next layer on the object for the second axis includes a distortion component of a projected image at a point in time when exposure of the selected at least one reference layer on the object to obtain information on overlay exposure of the next layer on the object for the second axis was performed, in a projection exposure apparatus that was used for the exposure of the selected at least one reference layer on the object to obtain information on overlay exposure of the next layer on the object for the second axis, wherein the distortion component of the projected image is computed using averaging processing of the selected plurality of reference layers or by weighted average processing in which weight is added to each of the selected plurality of reference layers, wherein the distortion component of the projected image is computed using averaging processing of the selected plurality of reference layers or by weighted average processing in which weight is added to each of the selected plurality of reference layers.

16. The apparatus according to claim 15, wherein the selected plurality of reference layers and the selected at least one reference layer together are layers that are overlaid sequentially on the object.

* * * * *

UNITED STATES PATENT AND TRADEMARK OFFICE
CERTIFICATE OF CORRECTION

PATENT NO.         : 8,605,248 B2                                       Page 1 of 1
APPLICATION NO.    : 11/915504
DATED              : December 10, 2013
INVENTOR(S)        : Masaharu Kawakubo It is certified that error appears in the above-identified patent and that said Letters Patent is hereby corrected as shown below:

In the Claims

In Column 32, Lines 13-18, In Claim 15, delete "layers,
wherein the distortion component of the projected image is computed using averaging processing of
the selected plurality of reference layers or by weighted average processing in which weight is added
to each of the selected plurality of reference layers." and insert -- layers. --, therefor.

Signed and Sealed this
Twenty-fifth Day of March, 2014

Michelle K. Lee
*Deputy Director of the United States Patent and Trademark Office*